(12) United States Patent
Maruyama

(10) Patent No.: US 12,672,379 B2
(45) Date of Patent: Jun. 30, 2026

(54) SOLID-STATE IMAGING DEVICE, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventor: Shunsuke Maruyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 367 days.

(21) Appl. No.: 18/258,336

(22) PCT Filed: Nov. 12, 2021

(86) PCT No.: PCT/JP2021/041644
§ 371 (c)(1),
(2) Date: Jun. 20, 2023

(87) PCT Pub. No.: WO2022/145138
PCT Pub. Date: Jul. 7, 2022

(65) Prior Publication Data
US 2024/0038814 A1 Feb. 1, 2024

(30) Foreign Application Priority Data
Dec. 28, 2020 (JP) ................................. 2020-218721

(51) Int. Cl.
H10F 39/00 (2025.01)
H10F 39/12 (2025.01)
(Continued)

(52) U.S. Cl.
CPC ......... H10F 39/811 (2025.01); H10F 39/018 (2025.01); H10F 39/182 (2025.01);
(Continued)

(58) Field of Classification Search
CPC .......... H04N 2201/03145; H04N 25/77; G01J 2001/446; H01L 2224/08145; H10F 39/19;
(Continued)

(56) References Cited

U.S. PATENT DOCUMENTS 10,229,948 B2 * 3/2019 Shimotsusa ........... H10F 39/018
10,257,454 B2 * 4/2019 Ito ......................... H10F 39/809
(Continued)

FOREIGN PATENT DOCUMENTS

| JP | 2011-530165 A | 12/2011 |
| JP | 2018-137284 A | 8/2018 |
| WO | 2018/194030 A1 | 10/2018 |

OTHER PUBLICATIONS

International Search Report and Written Opinion of PCT Application No. PCT/JP2021/041644, issued on Feb. 8, 2022, 11 pages of ISRWO.

*Primary Examiner* — Wael M Fahmy
*Assistant Examiner* — Thomas Wilson McCoy
(74) *Attorney, Agent, or Firm* — CHIP LAW GROUP

(57) ABSTRACT

Provided is a solid-state imaging device that includes a first semiconductor layer including a first photoelectric conversion element that photoelectrically converts light to a signal charge, and a charge holding region that holds the signal charge, a second semiconductor layer on the first semiconductor layer with a first insulating layer interposed therebetween and includes a second photoelectric conversion element that photoelectrically converts light, a circuit substrate unit on the second semiconductor layer with a second insulating layer interposed therebetween and includes a readout circuit that reads out the signal charge, an element-side first metal pad on the second insulating layer, a circuit-side first metal pad on the circuit substrate unit and is connected to the readout circuit and bonded to the element- (Continued)

side metal pad, and a first contact electrode that penetrates the first and second insulating layers and electrically connects the charge holding region and the element-side first metal pad.

17 Claims, 23 Drawing Sheets

(51) Int. Cl.
  *H10F 39/18* (2025.01)
  *H10W 72/90* (2026.01)
  *H10W 90/00* (2026.01)

(52) U.S. Cl.
  CPC ....... *H10F 39/1843* (2025.01); *H10F 39/199* (2025.01); *H10W 72/952* (2026.01); *H10W 90/792* (2026.01)

(58) Field of Classification Search
  CPC ...... H10F 39/12; H10F 39/018; H10F 77/957; H10W 72/90; H10W 90/00
  See application file for complete search history.

(56) References Cited

U.S. PATENT DOCUMENTS

| | | | |
|---|---|---|---|
| 2010/0026865 A1* | 2/2010 | Tivarus ............... | H10F 39/1847 |
| | | | 348/308 |
| 2011/0049591 A1* | 3/2011 | Nakatani ................ | H04N 25/77 |
| | | | 257/E31.127 |
| 2018/0220094 A1* | 8/2018 | Yang ...................... | H04N 25/78 |
| 2019/0371845 A1* | 12/2019 | Chen ..................... | H10F 39/807 |
| 2020/0273901 A1* | 8/2020 | Nakamura .............. | H01L 24/45 |

* cited by examiner

SOLID-STATE IMAGING DEVICE, METHOD OF MANUFACTURING THE SAME, AND ELECTRONIC DEVICE

CROSS REFERENCE TO RELATED APPLICATIONS

This application is a U.S. National Phase of International Patent Application No. PCT/JP2021/041644 filed on Nov. 12, 2021, which claims priority benefit of Japanese Patent Application No. JP 2020-218721 filed in the Japan Patent Office on Dec. 28, 2020. Each of the above-referenced applications is hereby incorporated herein by reference in its entirety.

TECHNICAL FIELD

The present technology (technology according to the present disclosure) relates to a solid-state imaging device, a method of manufacturing the solid-state imaging device, and an electronic device, and particularly relates to a technology effective for application to a solid-state imaging device that separately emits visible light and infrared light, a method of manufacturing the solid-state imaging device, and an electronic device.

BACKGROUND ART

As a solid-state imaging device, for example, as disclosed in Patent Document 1, a solid-state imaging device that separately receives visible light and infrared light is known. The solid-state imaging device disclosed in Patent Document 1 includes a first semiconductor layer having a light incident surface and having a visible light photoelectric conversion element that photoelectrically converts visible light incident from the light incident surface side, and a second semiconductor layer disposed on a side opposite to the light incident surface side of the first semiconductor layer and having an infrared photoelectric conversion element that photoelectrically converts infrared light incident from the incident surface side of the first semiconductor layer and transmitted through the first semiconductor layer. Then, the solid-state imaging device disclosed in Patent Document 1 further includes a circuit substrate unit disposed on a side opposite to the first semiconductor layer side of the second semiconductor layer and having a readout circuit that reads out signal charges photoelectrically converted by the visible light photoelectric conversion element and signal charges photoelectrically converted by the infrared photoelectric conversion element.

CITATION LIST

Patent Document

Patent Document 1: WO 2018/194030

SUMMARY OF THE INVENTION

Problems to be Solved by the Invention

Meanwhile, in the solid-state imaging device disclosed in Patent Document 1, a multilayer wiring layer is provided between the first semiconductor layer and the second semiconductor layer. In a case of such a structure, the light incident through the first semiconductor layer from the light incident surface side of the first semiconductor layer is shielded by wiring of the multilayer wiring layer, and there is a possibility that the photosensitivity in the infrared photoelectric conversion element decreases. Thus, there is room for improvement.

An object of the present technology is to provide a solid-state imaging device capable of improving photosensitivity, a method of manufacturing the solid-state imaging device, and an electronic device including the solid-state imaging device.

Solutions to Problems (1) A solid-state imaging device according to an aspect of the present technology includes:

a first semiconductor layer that includes a first photoelectric conversion element that has a first surface and a second surface located opposite to each other and photoelectrically converts light incident from a side of the second surface, and a charge holding region that holds a signal charge photoelectrically converted by the first photoelectric conversion element;

a second semiconductor layer that is disposed on a side of the first surface of the first semiconductor layer with a first insulating layer interposed therebetween and includes a second photoelectric conversion element that photoelectrically converts light incident from the side of the second surface of the first semiconductor layer;

a circuit substrate unit that is disposed on a side of the second semiconductor layer opposite to a side of the first insulating layer with a second insulating layer interposed therebetween and includes a readout circuit that reads out signal charges photoelectrically converted by the first photoelectric conversion element;

an element-side first metal pad that is provided on a side of the second insulating layer opposite to a side of the second semiconductor layer;

a circuit-side first metal pad that is provided on the circuit substrate unit and is electrically connected to the readout circuit and bonded to the element-side first metal pad; and a first contact electrode that penetrates the first and second insulating layers and electrically connects the charge holding region and the element-side first metal pad.

(2) A method of manufacturing a solid-state imaging device according to an aspect of the present technology includes:

forming a first photoelectric conversion element in a first semiconductor layer;

stacking a second semiconductor layer on a side opposite to a side of a light incident surface of the first semiconductor layer; and forming a second photoelectric conversion element in the second semiconductor layer stacked on the first semiconductor layer.

(3) An electronic device according to another aspect of the present technology includes:

the solid-state imaging device, an optical lens that forms an image of image light from a subject on an imaging surface of the solid-state imaging device, and a signal processing circuit that performs signal processing on a signal output from the solid-state imaging device.

BRIEF DESCRIPTION OF DRAWINGS

Figure 1A:
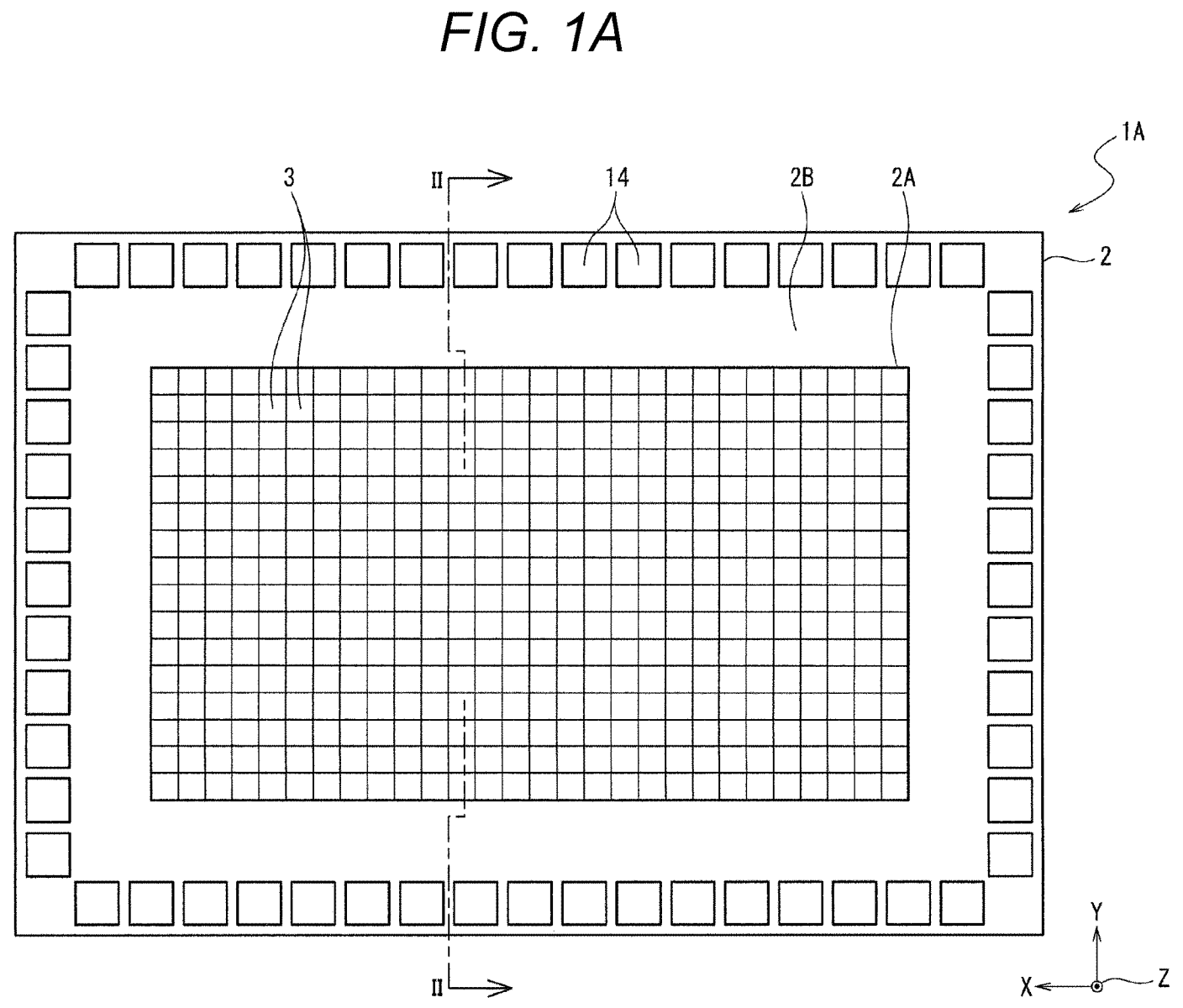

FIG. 1A is a schematic plan layout diagram illustrating a configuration example of a solid-state imaging device according to a first embodiment of the present technology.

FIG. 3 is an equivalent circuit diagram illustrating a configuration example of a pixel and a readout circuit of the solid-state imaging device according to the first embodiment of the present technology.

FIG. 4 is a schematic cross-sectional view in which a part of FIG. 1B is enlarged.

FIG. 8 is an equivalent circuit diagram illustrating a configuration example of a pixel and a readout circuit of a solid-state imaging device according to a second embodiment of the present technology.

FIG. 9 is an equivalent circuit diagram illustrating a configuration example of a pixel and a readout circuit of a solid-state imaging device according to a third embodiment of the present technology.

FIG. 10 is an equivalent circuit diagram illustrating a configuration example of a pixel and a readout circuit of a solid-state imaging device according to a fourth embodiment of the present technology.

MODE FOR CARRYING OUT THE INVENTION

Figure 1B:
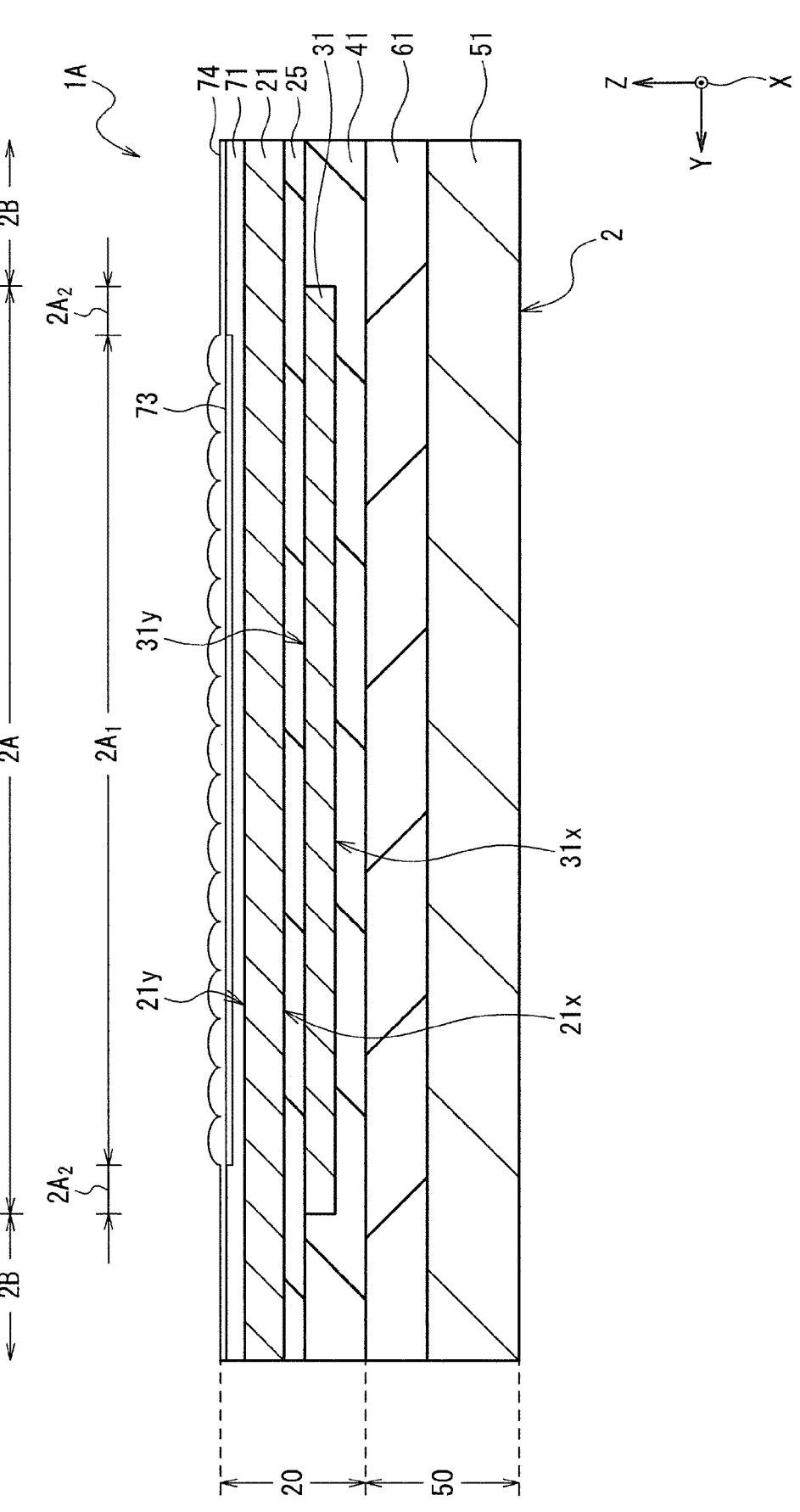
FIG. 1B is a schematic cross-sectional view illustrating a configuration example of a cross-sectional structure taken along line II-II in FIG. 1A.

Hereinafter, embodiments of the present technology will be described in detail with reference to the drawings.

Note that, in all the drawings for describing the embodiments of the present technology, components having the same functions are denoted by the same reference numerals, and repeated description thereof will be omitted.

In addition, each drawing is schematic and may be different from an actual one. Furthermore, the following embodiments illustrate a device and a method for embodying the technical idea of the present technology, and do not specify the configuration as follows. That is, various modifications can be made to the technical idea of the present technology within the technical scope described in the claims.

Furthermore, in the following embodiment, in three directions orthogonal to each other in a space, a first direction and a second direction orthogonal to each other in the same plane are defined as an X direction and a Y direction, respectively, and a third direction orthogonal to the first direction and the second direction is defined as a Z direction. In the following embodiment, a thickness direction of a semiconductor layer as described later will be described as a Z direction.

First Embodiment

In the first embodiment, an example in which the present technology is applied to a solid-state imaging device that is a back-illuminated complementary metal oxide semiconductor (CMOS) image sensor will be described.

<<Overall Configuration of Solid-State Imaging Device>>

First, an overall configuration of a solid-state imaging device 1A will be described.

Figure 17:
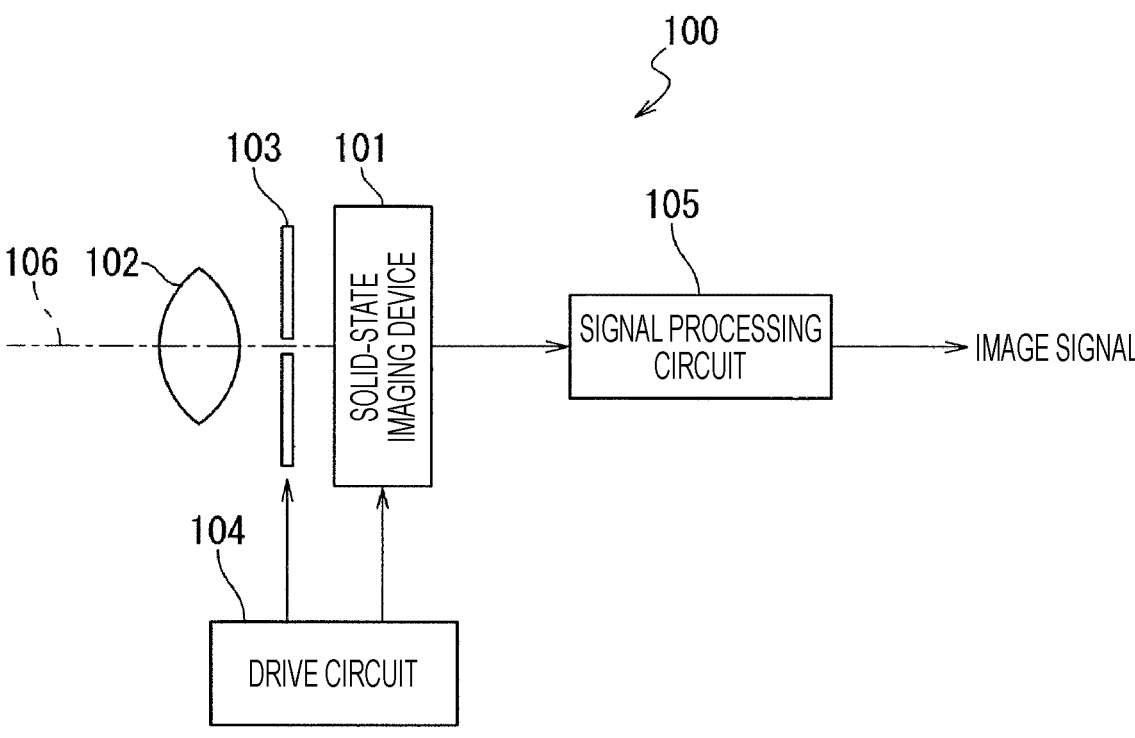
FIG. 17 is a diagram illustrating a schematic configuration of an electronic device according to a seventh embodiment of the present technology.

As illustrated in FIG. 1A, the solid-state imaging device 1A according to a first embodiment of the present technology mainly includes a semiconductor chip 2 having a rectangular two-dimensional planar shape in plan view. That is, the solid-state imaging device 1A is mounted on the semiconductor chip 2. As illustrated in FIG. 17, the solid-state imaging device 1A takes in image light (incident light 106) from a subject via an optical lens 102, converts a light amount of the incident light 106 formed on an imaging surface into an electrical signal in units of pixels, and outputs the electrical signal as a pixel signal.

As illustrated in FIGS. 1A and 1B, the semiconductor chip 2 on which the solid-state imaging device 1A is mounted includes, in a two-dimensional plane, a rectangular pixel region 2A provided in a central portion, and a peripheral region 2B arranged outside the pixel region 2A so as to surround the pixel region 2A.

The pixel region 2A is, for example, a light receiving surface that receives light condensed by an optical lens (optical system) 102 illustrated in FIG. 17. Then, in the pixel region 2A, a plurality of pixels 3 is arranged in a matrix on a two-dimensional plane including the X direction and the Y direction. The pixels 3 are repeatedly arranged in the X direction and the Y direction orthogonal to each other in the two-dimensional plane.

As illustrated in FIG. 1A, a plurality of bonding pads 14 is disposed in the peripheral region 2B. Each of the plurality of bonding pads 14 is arranged, for example, along four sides in a two-dimensional plane of the semiconductor chip 2. Each of the plurality of bonding pads 14 is an input-output terminal used when the semiconductor chip 2 is electrically connected to an external device.

Figure 4:
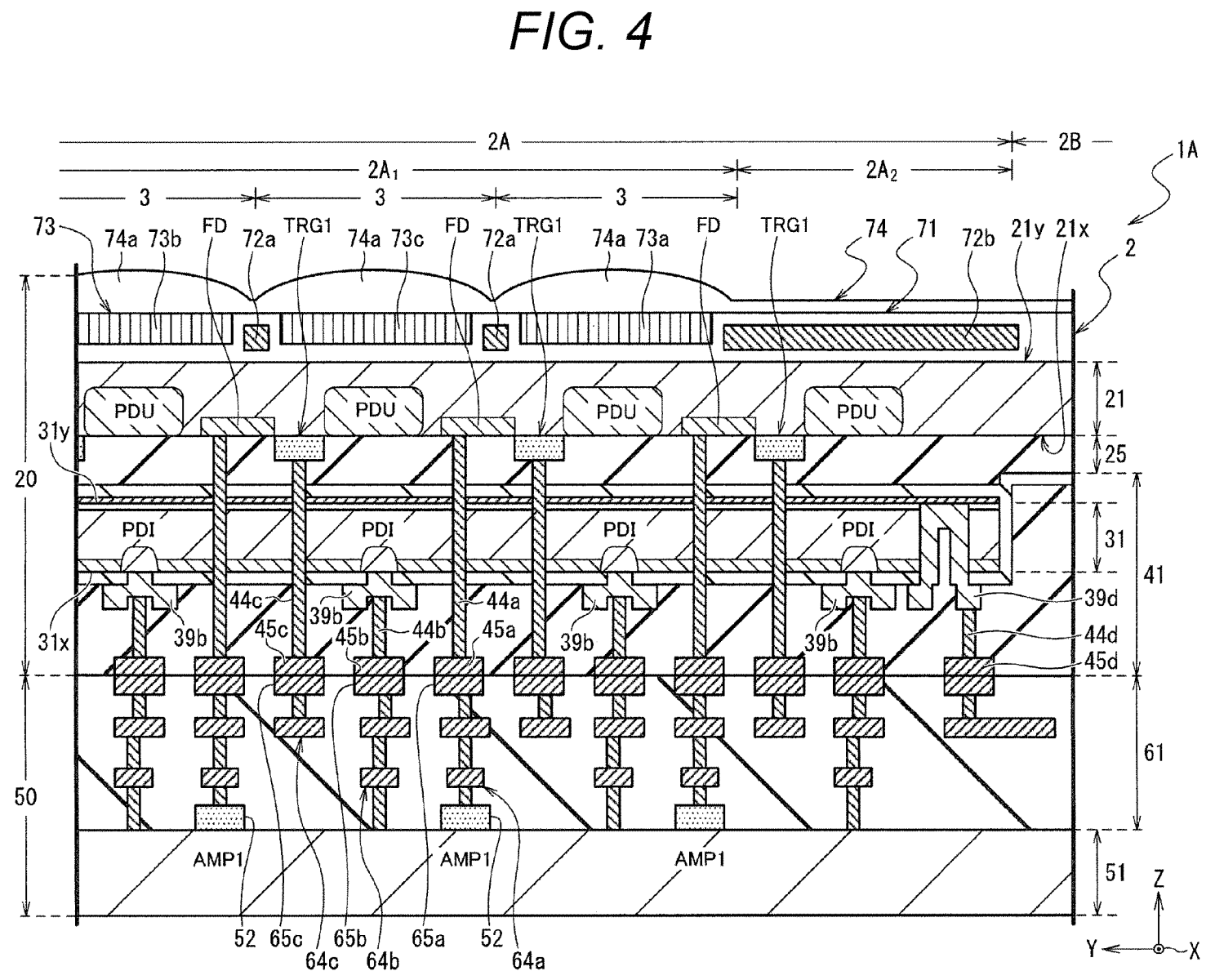

As illustrated in FIGS. 1B and 4, the pixel region 2A includes an effective pixel region $2A_1$ and an optical black region $2A_2$ that is disposed so as to surround the effective pixel region $2A_1$ and outputs an optical reference black level. As illustrated in FIG. 4, the optical black region $2A_2$ is covered with a light shielding film 72b to be described later.

Figure 2:
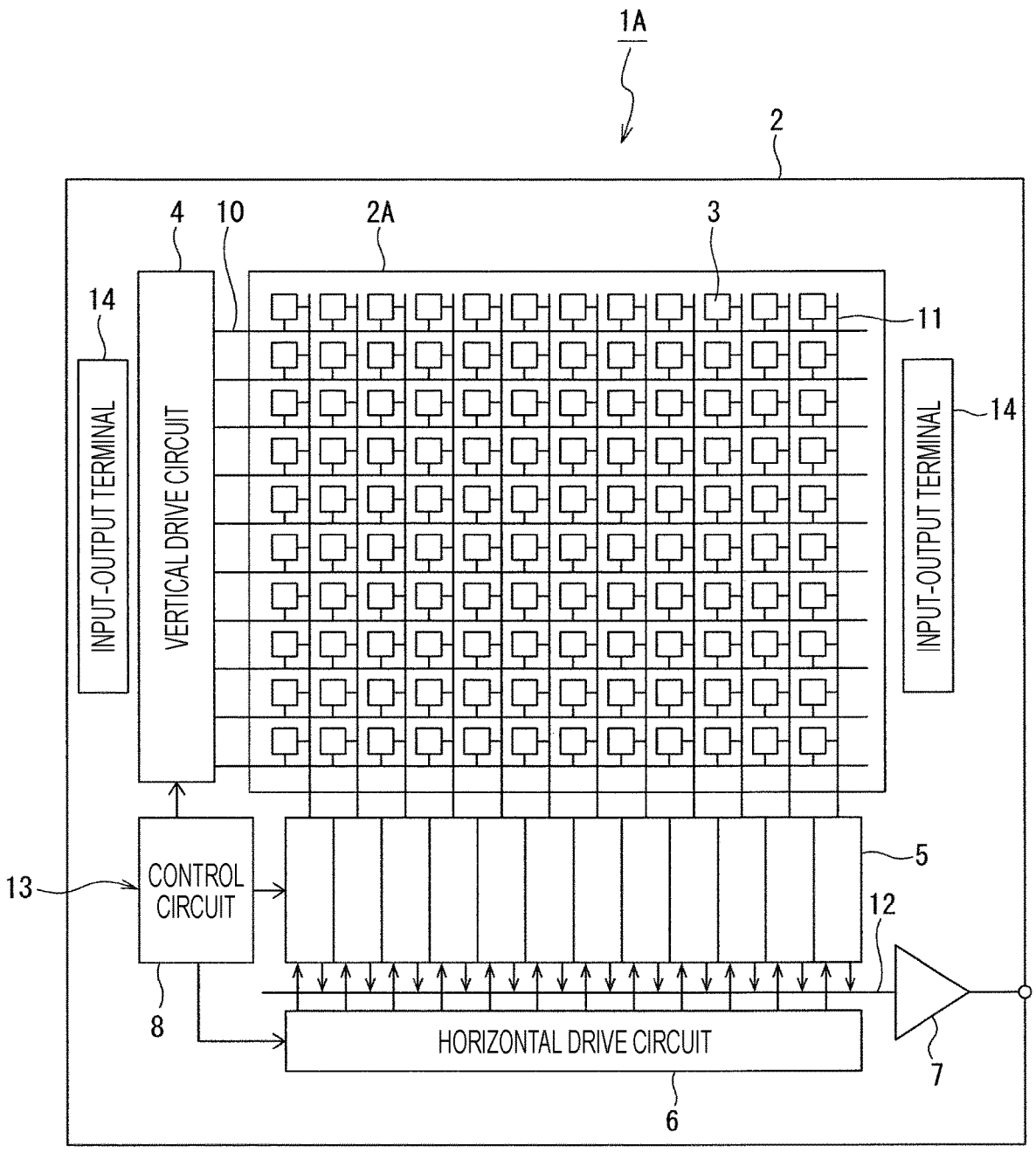
FIG. 2 is a block diagram illustrating a configuration example of the solid-state imaging device according to the first embodiment of the present technology.

As illustrated in FIG. 2, the semiconductor chip 2 includes a logic circuit 13 including a vertical drive circuit 4, a column signal processing circuit 5, a horizontal drive circuit 6, an output circuit 7, a control circuit 8, and the like. The logic circuit 13 includes, for example, a complementary MOS (CMOS) circuit including an n-channel conductive metal oxide semiconductor field effect transistor (MOSFET) and a p-channel conductive MOSFET.

The vertical drive circuit 4 includes, for example, a shift register. The vertical drive circuit 4 sequentially selects a desired pixel drive line 10, supplies a pulse for driving the pixel 3 to the selected pixel drive line 10, and drives each pixel 3 row by row. That is, the vertical drive circuit 4 selectively scans each pixel 3 in the pixel region 2A sequentially in a vertical direction in units of rows, and a pixel signal from the pixel 3 based on a signal charge generated according to the amount of received light by a photoelectric conversion element of each pixel 3 is supplied to the column signal processing circuit 5 through a vertical signal line 11.

The column signal processing circuit 5 is arranged, for example, on every column of the pixels 3 and performs signal processing, such as noise removal on signals output from the pixels 3 of one row, for every pixel column. For example, the column signal processing circuit 5 performs signal processing such as correlated double sampling (CDS) for removing pixel-specific fixed pattern noise and analog digital (AD) conversion.

The horizontal drive circuit 6 includes, for example, a shift register. The horizontal drive circuit 6 sequentially outputs horizontal scanning pulses to the column signal processing circuits 5 to sequentially select each of the column signal processing circuits 5, and causes each of the column signal processing circuits 5 to output the pixel signal subjected to the signal processing to a horizontal signal line 12.

The output circuit 7 performs signal processing on pixel signals sequentially supplied from each of the column signal processing circuits 5 through the horizontal signal line 12 and outputs processed signals. As the signal processing, for example, buffering, black level adjustment, column variation correction, various digital signal processing, and the like can be used.

The control circuit 8 generates a clock signal and a control signal, which are references for operations of the vertical drive circuit 4, the column signal processing circuit 5, the horizontal drive circuit 6, and the like on the basis of a vertical synchronization signal, a horizontal synchronization signal, and a master clock signal. Then, the control circuit 8 outputs the generated clock signal and control signal to the vertical drive circuit 4, the column signal processing circuit 5, the horizontal drive circuit 6, and the like.

Figure 3:
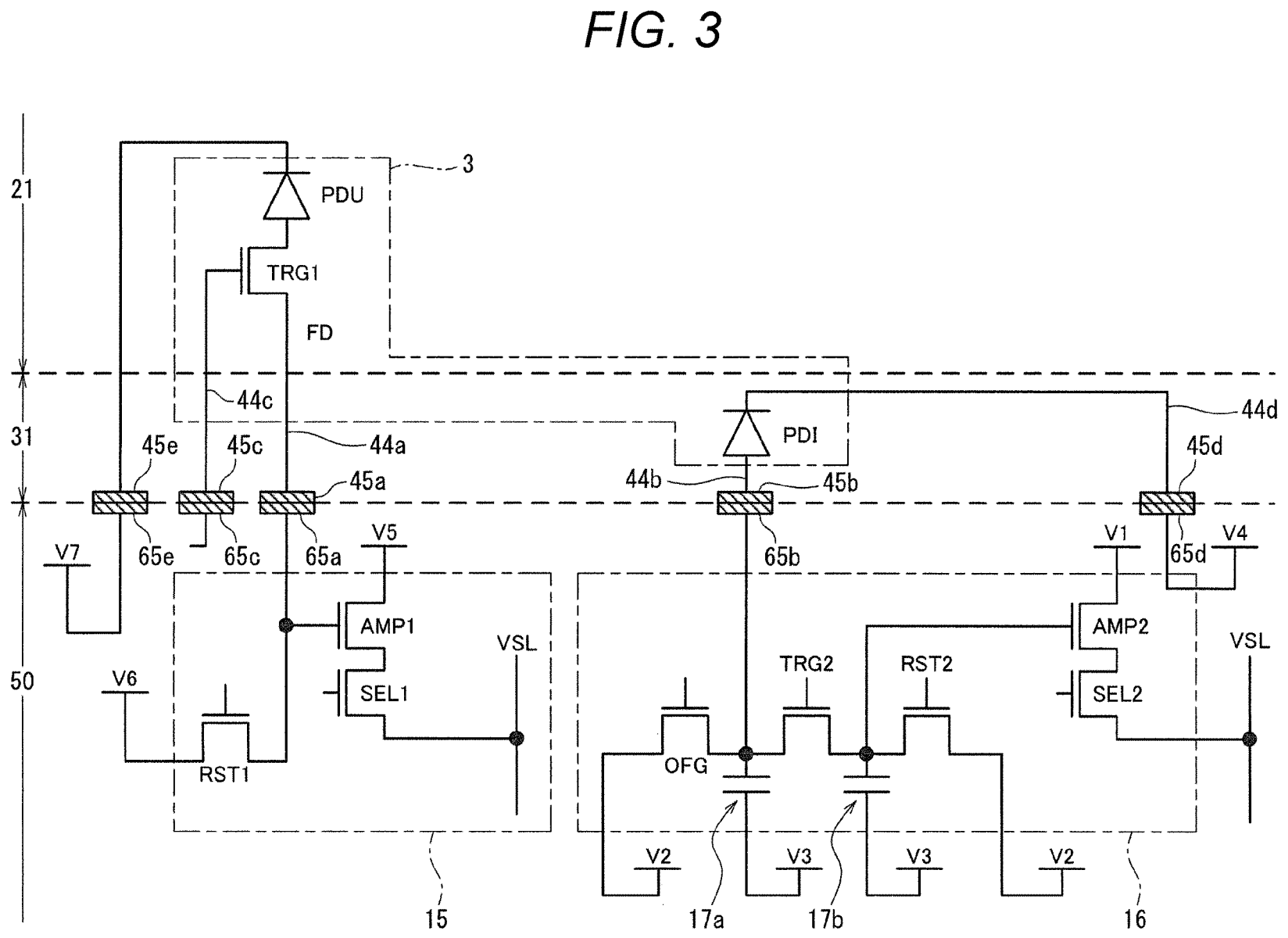

As illustrated in FIG. 3, the respective pixels 3 of the plurality of pixels 3 include a visible light photoelectric conversion element PDU as a first photoelectric conversion element, a transfer transistor TRG1 connected to the visible light photoelectric conversion element PDU, and a charge holding region (floating diffusion) FD that temporarily holds signal charges output from the visible light photoelectric conversion element PDU via the transfer transistor TRG1. Furthermore, in the first embodiment, the respective pixels 3 of the plurality of pixels 3 further include an infrared photoelectric conversion element PDI as a second photoelectric conversion element. The visible light photoelectric conversion element PDU photoelectrically converts light (visible light) having a wavelength in the visible region, generates a signal charge corresponding to the amount of received light, and holds the signal charge. The infrared photoelectric conversion element PDI photoelectrically converts light (infrared light) having a wavelength in the infrared region, generates a signal charge corresponding to the amount of received light, and holds the signal charge.

The transfer transistor TRG1 includes a metal oxide semiconductor field effect transistor (MOSFET) having a gate insulating film formed by, for example, a silicon oxide film ($SiO_2$ film), a gate electrode 24 (see FIG. 5A), and a pair of main electrode regions functioning as a source region and a drain region. In addition, the transfer transistor TRG1 may be a metal insulator semiconductor FET (MISFET) in which the gate insulating film is a silicon nitride film ($Si_3N_4$ film) or a stacked film including a silicon nitride film and a silicon oxide film, or the like. The charge holding region FD includes an n-type semiconductor region 23 as described later.

As illustrated in FIG. 3, in the visible light photoelectric conversion element PDU, an anode side is electrically connected to one main electrode region of the transfer transistor TRG1, and a cathode side is electrically connected to a reference potential wiring (for example, ground wiring) V7. The other main electrode region of the transfer transistor TRG1 is electrically connected to the charge holding region FD, and the gate electrode 24 of the transfer transistor TRG1 is electrically connected to a first transfer transistor drive wiring of the pixel drive line 10.

As illustrated in FIG. 3, a first readout circuit 15 as a readout circuit that reads out signal charges generated in the visible light photoelectric conversion element PDU and a second readout circuit 16 that reads out signal charges generated in the infrared photoelectric conversion element PDI are connected to the respective pixels 3 of the plurality of pixels 3. In the first embodiment, one pixel 3, one first readout circuit 15, and one second readout circuit 16 constitute one pixel unit.

Although not limited thereto, the first readout circuit 15 includes, for example, an amplification transistor AMP1, a selection transistor SEL1, and a reset transistor RST1. These transistors (AMP1, SEL1, and RST1) are configured by, for example, MOSFETs. Furthermore, these transistors (AMP1, SEL1, and RST1) may be MISFETs.

In the amplification transistor AMP1, one main electrode region is electrically connected to one main electrode region of the selection transistor SEL1, and the other main electrode region is electrically connected to a power supply line V5. Then, a gate electrode of the amplification transistor AMP1 is electrically connected to one main electrode region and a charge holding region FD of the reset transistor RST1.

In the selection transistor SEL1, one main electrode region is electrically connected to the one main electrode region of the amplification transistor AMP1, and the other main electrode region is electrically connected to a vertical signal line VSL (11). Then, a gate electrode of the selection transistor SEL1 is electrically connected to the first selection transistor drive wiring of the pixel drive line 10.

In the reset transistor RST1, one main electrode region is electrically connected to the gate electrode and the charge holding region FD of the amplification transistor AMP1, and the other main electrode region is electrically connected to a power supply line V6. Then, a gate electrode of the reset transistor RST1 is electrically connected to a first reset transistor drive wiring of the pixel drive line 10.

When turned on, the transfer transistor TRG1 transfers a signal charge of the visible light photoelectric conversion element PDU to the charge holding region FD. When turned on, the reset transistor RST1 resets the signal potential of the charge holding region FD to the potential of the power supply line V6. The selection transistor SEL1 controls an output timing of the pixel signal from the first readout circuit 15.

The amplification transistor AMP1 generates a signal of a voltage corresponding to the level of the signal charge held in the charge holding region FD as the pixel signal. The amplification transistor AMP1 constitutes a source follower type amplifier, and outputs a pixel signal having a voltage corresponding to the level of the signal charge generated in the visible light photoelectric conversion element PDU. When the selection transistor SEL1 is turned on, the amplification transistor AMP1 amplifies the signal charge of the charge holding region FD, and outputs a voltage corresponding to the signal charge to the column signal processing circuit 5 via the vertical signal line 11. That is, the first readout circuit 15 outputs a pixel signal based on the signal charge output from the visible light photoelectric conversion element PDU of the pixel 3.

As illustrated in FIG. 3, in the infrared photoelectric conversion element PDI, the anode side is electrically connected to the second readout circuit 16, and the cathode side is electrically connected to a reference potential wiring V4.

Although not limited thereto, the second readout circuit 16 includes, for example, a transfer transistor TRG2, a discharge transistor OFG, a reset transistor RST2, an amplification transistor AMP2, a selection transistor SEL2, and two capacitor elements 17a and 17b. These transistors (RTG2, OFG, RST2, AMP2, and SEL2) are configured by, for example, MOSFETs. Furthermore, these transistors (AMP1, SEL1, and RST1) may be MISFETs.

As illustrated in FIG. 3, in the infrared photoelectric conversion element PDI, the anode side is electrically connected to one main electrode region of the transfer transistor TRG2, one electrode of the capacitor element 17a, and one main electrode region of the discharge transistor OFG, and the cathode side is electrically connected to the reference potential wiring (for example, ground wiring) V4.

In the transfer transistor TRG2, one main electrode region is electrically connected to the anode side of the infrared photoelectric conversion element PDI, the one main electrode region of the discharge transistor OFG, and the one electrode of the capacitor element 17a, and the other main electrode region is electrically connected to one main electrode region of the reset transistor RST2, the one electrode of the capacitor element 17a, and the gate electrode of the amplification transistor AMP2. Then, a gate electrode of the transfer transistor TRG2 is electrically connected to the second transfer transistor drive wiring of the pixel drive line 10.

In the discharge transistor OFG, one main electrode region is electrically connected to the one main electrode region of the transfer transistor TRG2, an anode region of the infrared photoelectric conversion element PDI, the one electrode of the capacitor element 17a, and the other main electrode region is electrically connected to a power supply line V2. Then, the gate electrode of the discharge transistor OFG is electrically connected to the discharge transistor drive wiring of the pixel drive line 10.

In the reset transistor RST2, one main electrode region is electrically connected to the other main electrode region of the transfer transistor TRG2, the gate electrode of the amplification transistor AMP2, and one electrode of the capacitor element 17b, and the other main electrode region is electrically connected to the power supply line V2. Then, the gate electrode of the reset transistor RST2 is electrically connected to the second reset transistor drive wiring of the pixel drive line 10.

In the amplification transistor AMP2, one main electrode region is electrically connected to one main electrode region of the selection transistor SEL2, and the other main electrode region is electrically connected to a power supply line V1. Then, the gate electrode of the amplification transistor AMP2 is electrically connected to the other main electrode region of the transfer transistor TRG2, the one main electrode region of the reset transistor RST2, and the one electrode of the capacitor element 17b.

In the selection transistor SEL2, one main electrode region is electrically connected to one main electrode region of the amplification transistor AMP2, and the other main electrode region is electrically connected to the vertical signal line VSL (11). Then, a gate electrode of the selection transistor SEL2 is electrically connected to the second selection transistor drive wiring of the pixel drive line 10.

The other electrode of the capacitor element 17a and the other electrode of the capacitor element 17b are electrically connected to a power supply line V3.

The capacitor element 17a temporarily holds (accumulates) the signal charge generated in the infrared photoelectric conversion element PDI. When the transfer transistor TRG2 is turned on, the transfer transistor TRG2 transfers the signal charge of the capacitor element 16a to the capacitor element 17b. The capacitor element 17b temporarily holds (accumulates) the signal charge transferred via the transfer transistor TRG2.

When the discharge transistor OFG is turned on, the discharge transistor OFG discharges the signal charge accumulated in the capacitor element 17a. When the reset transistor RST2 is turned on, the reset transistor RST2 resets the signal potential of the capacitor element 17b to the potential of the power supply line V2. The selection transistor SEL2 controls the output timing of the pixel signal from the second readout circuit 16.

The amplification transistor AMP2 generates a signal of a voltage corresponding to the level of the signal charge accumulated in the capacitor element 17b as a pixel signal. The amplification transistor AMP2 constitutes a source follower type amplifier, and outputs a pixel signal having a voltage corresponding to the level of the signal charge generated in the infrared photoelectric conversion element PDI. When the selection transistor SEL2 is turned on, the amplification transistor AMP2 amplifies the signal charge of the capacitor element 17b and outputs a voltage corresponding to the signal charge to the column signal processing circuit 5 via the vertical signal line 11. That is, the second readout circuit 16 outputs a pixel signal based on the signal charge output from the infrared photoelectric conversion element PDI of the pixel 3.

<<Specific Configuration of Solid-State Imaging Device>>

Next, a specific configuration of the solid-state imaging device 1A will be described.

As illustrated in FIGS. 1B and 4, the semiconductor chip 2 includes a photoelectric conversion substrate unit 20 and a circuit substrate unit 50 stacked to face each other. In the photoelectric conversion substrate unit 20, the above-described pixel region 2A and the like are formed. The circuit substrate unit 50 includes the logic circuit 13, the bonding pad 14, the first readout circuit 15, the second readout circuit 16, and the like described above.

<Photoelectric Conversion Substrate Unit>

As illustrated in FIGS. 1B and 4, the photoelectric conversion substrate unit 20 includes a first semiconductor layer 21 having a first surface 21$x$ and a second surface 21$y$ located opposite to each other, a second semiconductor layer 31 disposed on the first surface 21$x$ side of the first semiconductor layer 21 with a first insulating layer 25 interposed therebetween, and a second insulating layer 41 disposed on the side of the second semiconductor layer 31 opposite to the first insulating layer 25 side.

Here, the first surface 21$x$ of the first semiconductor layer 21 may be referred to as an element formation surface or a main surface, and the second surface 21$y$ may be referred to as a light incident surface or a back surface. Also on a first surface 31$x$ and a second surface 31$y$ located on opposite sides of the second semiconductor layer 31, the first surface 31$x$ may be referred to as an element formation surface or a main surface, and the second surface 31$y$ may be referred to as a light incident surface or a back surface.

Each of the first semiconductor layer 21 and the second semiconductor layer 31 has a two-dimensional planar shape of a square shape. Then, an outline of the second semiconductor layer 31 in plan view is located inside an outline of the first semiconductor layer 21. That is, the second semiconductor layer 31 is formed to have a plane size smaller than the plane size of the first semiconductor layer 21. Therefore, the first surface 31$x$ side and a side surface side of the second semiconductor layer 31 are covered with the second insulating layer 41. Then, the step between the second semiconductor layer 31 and the first semiconductor layer 21 is filled with the second insulating layer 41.

Figure 5A:
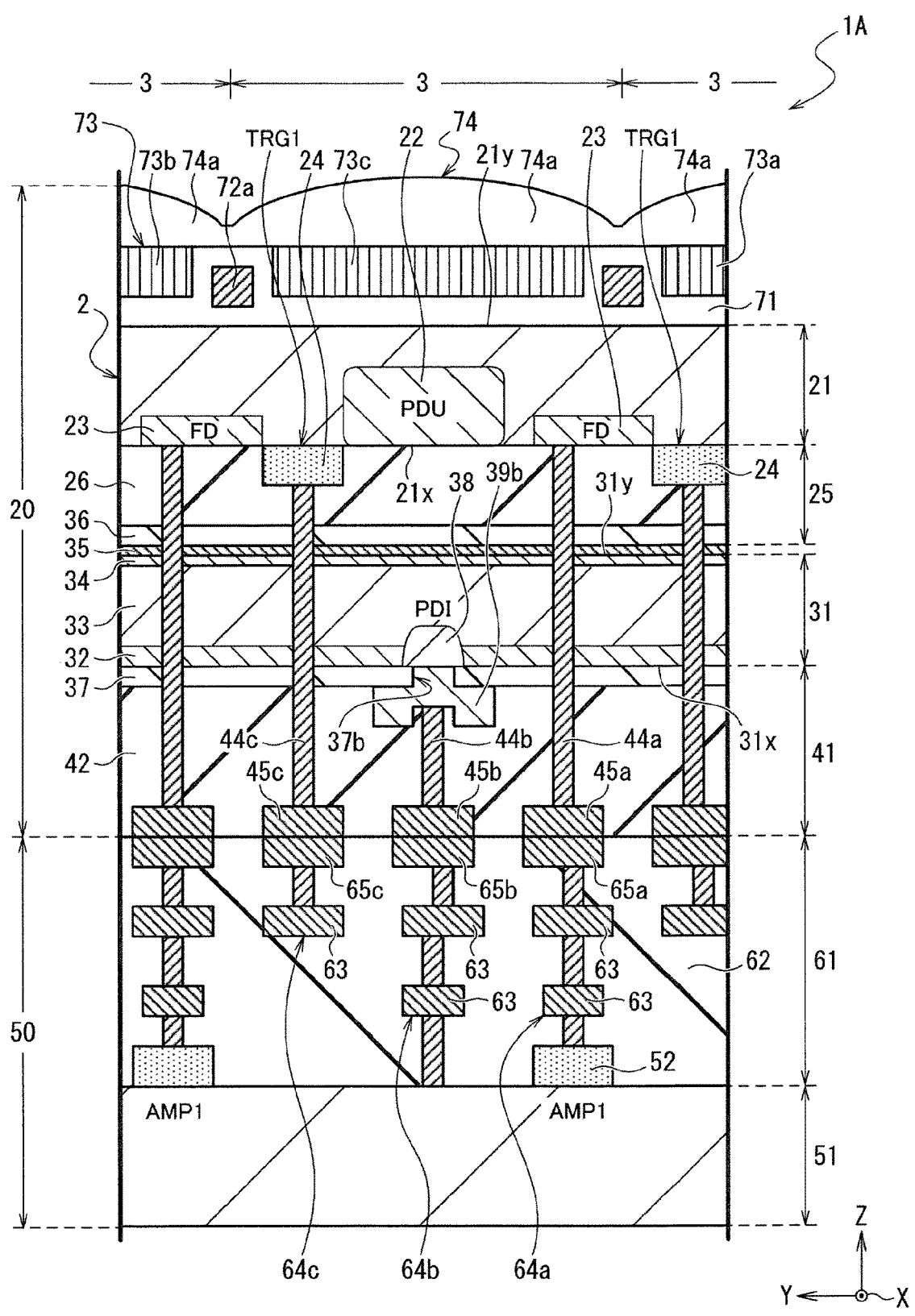
FIG. 5A is an enlarged cross-sectional view of a main part in which a part of FIG. 4 is enlarged.
Figure 5B:
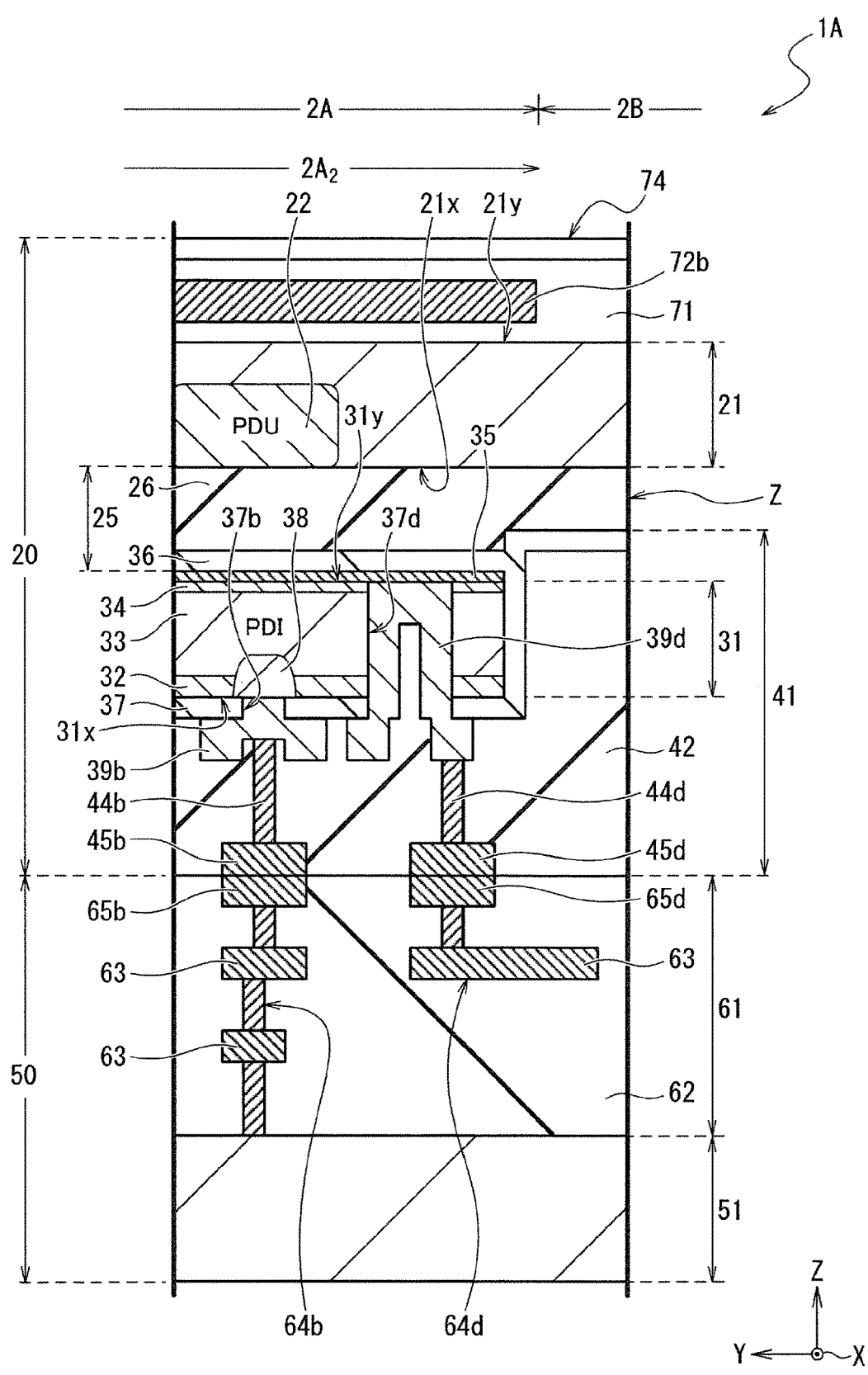
FIG. 5B is an enlarged cross-sectional view of a main part in which a part of FIG. 4 is enlarged.

As illustrated in FIGS. 4, 5A, and 5B, the photoelectric conversion substrate unit 20 further includes an insulating layer 71, a color filter layer 73, and a microlens layer 74 sequentially stacked from the light incident surface side on the light incident surface side which is the second surface 21$y$ side of the first semiconductor layer 21. The insulating layer 71 includes a planarization film and an adhesive film, and light shielding films 72$a$ and 72$b$ disposed between the planarization film and the adhesive film.

The insulating layer 71 covers the second surface 21$y$ of the first semiconductor layer 21. The insulating layer 71 is provided over the pixel region 2A and the peripheral region 2B in plan view. The planarization film and the adhesive film of the insulating layer 71 include, for example, a silicon oxide film ($SiO_2$ film).

The light shielding film 72$a$ is arranged in the effective pixel region 2A$_1$ of the pixel region 2A in plan view. In the light shielding film 72$a$, a planar pattern in plan view is a lattice-shaped planar pattern so as to partition the adjacent pixels 3. The light shielding film 72$b$ is provided in the optical black region 2A$_2$ of the pixel region 2A in plan view. The light shielding film 72$b$ is an annular planar pattern that covers the optical black region 2A$_2$ such that a planar pattern in plan view surrounds the effective pixel region 2A$_1$. The light shielding films 72$a$ and 72$b$ include, for example, a composite film in which a titanium film (Ti film) and a tungsten film (W film) are sequentially stacked from the first semiconductor layer 21 side.

As illustrated in FIG. 5A, the color filter layer 73 is mainly provided in the effective pixel region 2A$_1$ of the pixel region 2A. The color filter layer 73 includes, for example, a red (R) first color filter portion 73$a$, a green (G) second color filter portion 73$b$, and a blue (B) third color filter portion 73$c$. The first to third color filter portions 73$a$ to 73$c$ are arranged in a matrix corresponding to the respective pixels 3 of the plurality of pixels 3.

As illustrated in FIG. 4, the microlens layer (on-chip lens layer) 74 includes a plurality of microlens portions 74$a$ arranged in the effective pixel region 2A$_1$ of the pixel region 2A. The respective microlens portions 74$a$ of the plurality of microlens portions 74$a$ are arranged in a matrix corresponding to the respective pixels 3 of the plurality of pixels 3. The microlens portion 74$a$ condenses irradiation light and allows the condensed light to efficiently enter the pixel 3. The microlens layer 74 is formed by, for example, a resin material.

(First Semiconductor Layer)

As illustrated in FIGS. 4 and 5A, the first semiconductor layer 21 is provided with the above-described visible light photoelectric conversion element PDU that photoelectrically converts visible light out of light incident from the light incident surface side, which is the second surface 21$y$ side of the first semiconductor layer 21. Then, the second semiconductor layer 31 is provided with the above-described infrared photoelectric conversion element PDI that photoelectrically converts infrared light out of light incident from the light incident surface side (second surface 21$y$ side) of the first semiconductor layer 21.

Each of the visible light photoelectric conversion element PDU and the infrared photoelectric conversion element PDI is arranged in every pixel 3. Then, the visible light photoelectric conversion element PDU and the infrared photoelectric conversion element PDI are arranged so as to overlap each other in plan view. Therefore, the infrared photoelectric conversion element PDI of the first embodiment photoelectrically converts infrared light out of light incident from the light incident surface side of the first semiconductor layer 21 and transmitted through the first semiconductor layer 21 and the first insulating layer 25.

In the first semiconductor layer 21, the transfer transistor TRG1 and the charge holding region FD described above are provided together with the visible light photoelectric conversion element PDU. The first semiconductor layer 21 includes, for example, a p-type silicon substrate. The visible light photoelectric conversion element PDU includes, for example, a photoelectric conversion unit 22 provided in the first semiconductor layer 21. In the photoelectric conversion unit 22, signal charges corresponding to the amount of incident light are generated and accumulated. The photoelectric conversion unit 22 includes, for example, an n-type semiconductor region, and is provided in every pixel 3 in the first semiconductor layer 21.

The charge holding region FD mainly includes, for example, an n-type semiconductor region 23 provided in a surface layer portion on the first surface 21$x$ side (element formation surface side) of the first semiconductor layer 21. In the semiconductor region 23, the signal charge transferred from the visible light photoelectric conversion element PDU via the transfer transistor TRG1 is temporarily held (accumulated).

The transfer transistor TRG1 is configured on the first surface 21x side of the first semiconductor layer 21. Although not illustrated in detail, the transfer transistor TRG1 includes a gate insulating film (not illustrated) provided on the first surface 21x side of the first semiconductor layer 21, the gate electrode 24 provided on the gate insulating film on the side opposite to the first semiconductor layer 21 side, a channel formation region provided in the surface layer portion of the first semiconductor layer 21 on the side opposite to the gate electrode 24 side of the gate insulating film, and a pair of main electrode regions disposed on both sides in a channel length direction (gate length direction) of the channel formation region and functioning as a source region and a drain region. One of the pair of main electrode regions is constituted by the photoelectric conversion unit 22, and the other is constituted by the n-type semiconductor region 23. Then, in the transfer transistor TRG1, a channel electrically connecting the photoelectric conversion unit 22 and the semiconductor region 23 is formed in the channel formation region by voltage applied to the gate electrode 24, and the signal charge photoelectrically converted by the visible light photoelectric conversion element PDU (photoelectric conversion unit 22) is transferred to the charge holding region FD (semiconductor region 23).

As illustrated in FIG. 5A, the first surface 21x side of the first semiconductor layer 21 is covered with the first insulating layer 25. Then, the transfer transistor TRG1 and the charge holding region FD are also covered with the first insulating layer 25. The first semiconductor layer 21 and the first insulating layer 25 are provided over the pixel region 2A and the peripheral region 2B in plan view.

The first insulating layer 25 includes, but is not limited to, an insulating film 26 covering the first surface 21x side of the first semiconductor layer 21 and a protective film 36 covering the second surface 31y side of the second semiconductor layer 31 as described later. As the insulating film 26 and the protective film 36, for example, a silicon oxide (SiO₂) film having optical transparency can be used.

(Second Semiconductor Layer)

As illustrated in FIGS. 5A and 5B, the first surface 31x and an end surface (side surface) of the second semiconductor layer 31 are covered with the second insulating layer 41. The second insulating layer 41 includes, but is not limited to, an insulating film 37 covering the first surface 31x and the side surface of the second semiconductor layer 31, and an insulating film 42 covering the insulating film 37, for example. The insulating film 37 is provided over the pixel region 2A and the peripheral region 2B in plan view, is in contact with the first surface 31x of the second semiconductor layer 31 in the pixel region 2A, and is in contact with the first insulating layer 25 in the peripheral region 2B. The insulating film 42 is also provided over the pixel region 2A and the peripheral region 2B, and is in contact with the insulating film 37 in the pixel region 2A and the peripheral region 2B. That is, the second insulating layer 41 is provided over the pixel region 2A and the peripheral region 2B.

A second electrode 35 is provided on the second surface 31y of the second semiconductor layer 31 so as to cover the second surface 31y. Then, the second electrode 35 is covered with the protective film 36 on the side opposite to the second semiconductor layer 31 side. The second electrode 35 and the protective film 36 terminate at an end of an outer periphery of the second semiconductor layer 31 (see FIG. 5B).

The second semiconductor layer 31 includes, for example, a cap layer 32, a photoelectric conversion layer 33, and a contact layer 34 from the second insulating layer 41 side. The cap layer 32, the photoelectric conversion layer 33, and the contact layer 34 have the same planar shape, and respective end surfaces thereof are disposed at the same position in plan view. The second semiconductor layer 31 is a multilayer body in which the cap layer 32, the photoelectric conversion layer 33, and the contact layer 34 are epitaxially grown on the growth substrate in this order.

The cap layer 32 is provided in common for all the pixels 3, for example, and is disposed between the insulating film 37 and the photoelectric conversion layer 33. The cap layer 32 is provided with a plurality of contact regions 38 including, for example, a semiconductor region (impurity diffusion region). By using a compound semiconductor material having a band gap larger than the band gap of the compound semiconductor material constituting the photoelectric conversion layer 33 for the cap layer 32, dark current can be suppressed. For the cap layer 32, for example, n-type indium phosphide (InP) can be used.

The respective contact regions 38 of each of the plurality of contact regions 38 are arranged in every pixel 3 while being separated from each other. Then, a first electrode 39b is individually connected to each contact region 38 through an opening 37b provided in the insulating film 37. The contact region 38 is also provided in the optical black region 2A₂.

The contact region 38 is for reading out signal charges generated in the photoelectric conversion layer 33 from each pixel 3, and contains, for example, p-type impurities. Examples of the p-type impurities include zinc (Zn) or the like. In this manner, a pn junction interface is formed between the contact region 38 and the cap layer 32 other than the contact region 38, and the adjacent pixels 3 are electrically isolated. The contact region 38 is configured to be thicker than the thickness of the cap layer 32, and is also provided in a part of the photoelectric conversion layer 33 in the thickness direction (Z direction).

The photoelectric conversion layer 33 between the first electrode 39b and the second electrode 35, more specifically, between the cap layer 32 and the contact layer 34 is provided in common for all the pixels 3, for example. The photoelectric conversion layer 33 absorbs light having a predetermined wavelength, infrared light in the first embodiment, and generates signal charges, and includes, for example, a compound semiconductor material such as an i-type group III-V semiconductor. Examples of the compound semiconductor material constituting the photoelectric conversion layer 33 include indium gallium arsenide (InGaAs), indium arsenide antimony (InAsSb), indium arsenide (InAs), indium antimony (InSb), mercury cadmium telluride (HgCdTe), and the like. The photoelectric conversion layer 33 may include germanium (Ge). In the photoelectric conversion layer 33, for example, photoelectric conversion of light having a wavelength in an infrared region is performed.

The contact layer 34 is provided in common for all the pixels 3, for example. The contact layer 34 is provided between the photoelectric conversion layer 33 and the second electrode 35, and is in contact with the photoelectric conversion layer 33 and the second electrode 35. The contact layer 34 is a region where signal charges discharged from the second electrode 35 move, and includes, for example, a compound semiconductor containing an n-type impurity. As the n-type impurity, for example, indium phosphorus (InP) can be used.

The second electrode 35 is provided on the light incident surface side of the contact layer 34 so as to be in contact with the contact layer 34, for example, as an electrode common to the respective pixels 3. The second electrode 35 is for discharging charges that are not used as signal charges among the charges generated in the photoelectric conversion layer 33 (cathode). For example, in a case where holes are read out from the first electrode 39*b* as signal charges, for example, electrons can be discharged through the second electrode 35. The second electrode 35 includes, for example, a conductive film capable of transmitting incident light such as infrared light. As the second electrode 35, for example, indium tin oxide (ITO) or indium tin oxide (ITiO) (In$_2$O$_3$—TiO$_2$), or the like can be used. For example, the second electrodes 35 may be provided in a lattice shape so as to partition the adjacent pixels 3. For the second electrode 35, a conductive material having low optical transparency can be used.

The protective film 36 covers the second electrode 35 from the side opposite to the second semiconductor layer 31 side. The protective film 36 may have an antireflection function. As the protective film 36, for example, silicon nitride (SiN), aluminum oxide (Al$_2$O$_3$), silicon oxide (SiO$_2$), tantalum oxide (Ta$_2$O$_3$), or the like can be used.

The insulating film 37 is provided between the cap layer 32 and the second insulating layer 41. The insulating film 37 covers the end surface of the cap layer 32, the end surface of the photoelectric conversion layer 33, the end surface of the contact layer 34, and an end surface of the second electrode 35, and is in contact with the first insulating layer 25 in the peripheral region 2B (see FIG. 5B). The insulating film 37 includes, for example, an oxide such as silicon oxide (Siox) or aluminum oxide (Al$_2$O$_3$). The insulating film 37 may have a stacked structure in which a plurality of films is stacked. The insulating film 37 may include, for example, a silicon (Si) insulating material such as silicon oxynitride (SiON), carbon-containing silicon oxide (SiOC), silicon nitride (SiN), and silicon carbide (SiC). The thickness of the insulating film 37 is, for example, about several tens nm to several hundreds nm.

As illustrated in FIG. 5B, a lead-out electrode 39*d* is electrically and mechanically connected to the second electrode 35 through a connection hole penetrating from the first surface 31*x* side to the second surface 31*y* side of the second semiconductor layer 31. Thus, a voltage is supplied from the circuit substrate unit 50 side to the second electrode 35 via the lead-out electrode 39*d*. The lead-out electrode 39*d* is formed in the same step as the first electrode 39*b*, for example, and includes the same material as the first electrode 39*b*. The first electrode 39*b* and the lead-out electrode 39*d* include, for example, any single substance of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of them. The first electrode 39*b* and the lead-out electrode 39*d* may be a single film of such a constituent material, or may be a stacked film obtained by combining two or more kinds. For example, each of the first electrode 39*b* and the lead-out electrode 39*d* includes a stacked film of titanium and tungsten, and has a film thickness of about several tens nm to several hundreds nm.

The first electrode 39*b* is an electrode (anode) to which a voltage for reading out signal charges (holes or electrons, hereinafter, for convenience, the description will be made on the assumption that the signal charges are holes) generated in the photoelectric conversion layer 33 is supplied, and is provided in every pixel 3 in the pixel region 2A. That is, the infrared photoelectric conversion element PDI including the first electrode 39*b*, the photoelectric conversion layer 33, and the second electrode 35 is provided in every pixel 3.

As illustrated in FIGS. 5A and 5B, an element-side first metal pad 45*a*, an element-side second metal pad 45*b*, an element-side third metal pad 45*c*, and an element-side fourth metal pad 45*d* are provided as the element-side metal pads in a surface layer portion of the second insulating layer 41 on the side opposite to the second semiconductor layer 31 side, in other words, the surface layer portion of the second insulating layer 41 on the circuit substrate unit 50 side. Each of these element-side metal pads 45*a*, 45*b*, 45*c*, and 45*d* is embedded in the second insulating layer 41 in a state where each bonding surface is exposed from the second insulating layer 41.

Furthermore, although not illustrated in FIGS. 5A and 5B, an element-side fifth metal pad 45*e* illustrated in FIG. 3 is provided as an element-side metal pad in the surface layer portion of the second insulating layer 41 on the circuit substrate unit 50 side. The element-side fifth metal pad 45*e* is also embedded in the second insulating layer 41 in a state where the bonding surface is exposed from the second insulating layer 41.

The element-side first to fifth metal pads 45*a* to 45*e* are electrically and mechanically connected to circuit-side first to fifth metal pads 65*a* to 65*e*, respectively, provided as circuit-side metal pads in a multilayer wiring layer 61 of the circuit substrate unit 50 as described later by metal-to-metal bonding. Each of the element-side first to fifth metal pads 45*a* to 45*e* includes, for example, copper (Cu) or a Cu alloy containing Cu as a main component.

<Circuit Substrate Unit>

As illustrated in FIG. 4, the circuit substrate unit 50 includes a semiconductor substrate 51 and the multilayer wiring layer 61 disposed on a first surface side of a first surface and a second surface located on opposite sides of the semiconductor substrate 51.

On the semiconductor substrate 51 of the circuit substrate unit 50, for example, a plurality of MOSFETs is configured as field effect transistors constituting the above-described logic circuit 13, the first and second readout circuits 15 and 16, and the like. FIGS. 4 and 5A illustrate a gate electrode 52 of the amplification transistor AMP1 constituting the first readout circuit 15. As the semiconductor substrate 51, for example, a semiconductor substrate including single crystal silicon can be used.

As illustrated in FIGS. 5A and 5B, the multilayer wiring layer 61 of the circuit substrate unit 50 has a three-layer wiring structure in which wiring layers are stacked, for example, in three stages via an interlayer insulating film 62.

As illustrated in FIGS. 5A and 5B, a third wiring layer from the semiconductor substrate 51 side, that is, an uppermost wiring layer of the multilayer wiring layer 61 is provided with a circuit-side first metal pad 65*a*, a circuit-side second metal pad 65*b*, a circuit-side third metal pad 65*c*, and a circuit-side fourth metal pad 65*d* as circuit-side metal pads. Each of these circuit-side metal pads 65*a*, 65*b*, 65*c*, and 65*d* is embedded in the interlayer insulating film 62 in a state where each bonding surface is exposed from the interlayer insulating film 62.

Furthermore, although not illustrated in FIGS. 5A and 5B, a circuit-side fifth metal pad 65*e* illustrated in FIG. 3 is also provided in the uppermost wiring layer. The circuit-side fifth metal pad 65*e* is also embedded in the interlayer insulating film 62 in a state where the bonding surface is exposed from the interlayer insulating film 62.

The circuit-side first metal pad 65*a* is bonded to the element-side first metal pad 45*a* with the bonding surfaces facing each other (opposing each other). The circuit-side second metal pad 65*b* is bonded to the element-side second metal pad 45*b* with the bonding surfaces facing each other. The circuit-side third metal pad 65*c* is bonded to the element-side third metal pad 45*c* with the bonding surfaces facing each other. The circuit-side fourth metal pad 65*d* is bonded to the element-side fourth metal pad 45*d* with the bonding surfaces facing each other (opposing each other). Then, the circuit-side fifth metal pad 65*e* is also bonded to the element-side fifth metal pad 45*e* with the bonding surfaces facing each other.

Similarly to the above-described element-side first to fifth metal pads 45*a* to 45*e*, each of the circuit-side first to fifth metal pads 65*a* to 65*e* includes, for example, copper (Cu) or a Cu alloy containing Cu as a main component. A wiring 63 of the first and second wiring layers includes, for example, aluminum (Al) or an Al alloy containing Al as a main component.

As illustrated in FIG. 5A, the circuit-side first metal pad 65*a* is electrically connected to one end side of a first wiring path 64*a* including the wiring 63 provided in each wiring layer and a contact electrode electrically connecting the wirings 63 of different wiring layers. Then, the other end side of the first wiring path 64*a* is electrically connected to the gate electrode 52 of the amplification transistor AMP1 among the transistors constituting the first readout circuit 15. Then, referring to FIG. 3, the gate electrode 52 of the amplification transistor AMP1 is electrically connected to one main electrode region of the reset transistor RST1 constituting the first readout circuit 15. That is, the circuit-side first metal pad 65*a* is electrically connected to the first readout circuit 15 via the first wiring path 64*a* of the multilayer wiring layer 61.

As illustrated in FIG. 5A, the circuit-side second metal pad 65*b* is electrically connected to one end side of a second wiring path 64*b* including the wiring 63 provided in each wiring layer and a contact electrode electrically connecting the wirings 63 of the different wiring layers. Then, the other end side of the second wiring path 64*b* is electrically connected to, for example, the one main electrode region of the transfer transistor TRG2 among the transistors constituting the second readout circuit 16, referring to FIG. 3. Then, the one main electrode region of the transfer transistor TRG2 is electrically connected to the one main electrode region of the discharge transistor OFG and the one electrode of the capacitor element 17*a* constituting the second readout circuit 16. That is, the circuit-side second metal pad 65*b* is electrically connected to the second readout circuit 16 via the second wiring path 64*b* of the multilayer wiring layer 61. Note that the other end side of the second wiring path 64*b* may be directly connected to the one main electrode region of the discharge transistor OFG, or may be directly connected to the one electrode of the capacitor element 17*a*.

As illustrated in FIG. 5A, the circuit-side third metal pad 65*c* is electrically connected to one end side of a third wiring path 64*c* including the wiring 63 provided in each wiring layer and a contact electrode electrically connecting the wirings 63 of the different wiring layers. Then, although not illustrated, the other end side of the third wiring path 64*c* is electrically connected to the first transfer transistor drive wiring of the pixel drive line 10. That is, the circuit-side third metal pad 65*c* is electrically connected to the logic circuit 13 of the circuit substrate unit 50 via the third wiring path 64*c* of the multilayer wiring layer 61.

As illustrated in FIG. 5B, the circuit-side fourth metal pad 65*d* is electrically connected to one end side of a fourth wiring path 64*d* including the wiring 63 provided in each wiring layer and a contact electrode electrically connecting the wirings 63 of the different wiring layers. Then, although not illustrated in detail, the other end side of the fourth wiring path 64*d* is electrically connected to the reference potential wiring V4 referring to FIG. 3. That is, the circuit-side fourth metal pad 65*d* is electrically connected to the reference potential wiring V4 of the circuit substrate unit 50 via the fourth wiring path 64*d* of the multilayer wiring layer 61.

Note that, although not illustrated in detail, the circuit-side fifth metal pad 65*e* is similarly electrically connected to one end side of a fifth wiring path including the wiring 63 provided in each wiring layer and a contact electrode electrically connecting the wirings 63 of the different wiring layers. Then, referring to FIG. 3, the other end side of the fifth wiring path is electrically connected to the reference potential wiring V7. That is, the metal pad 65*e* is electrically connected to the reference potential wiring V7 of the circuit substrate unit 50 via the fifth wiring path of the multilayer wiring layer 61.

<Conductive Path>

As illustrated in FIG. 5A, the semiconductor chip 2 further includes a first contact electrode (through hole wiring, via wiring) 44*a* that penetrates the first insulating layer 25 and the second insulating layer 41 and electrically connects the charge holding region FD of the first semiconductor layer 21 and the element-side first metal pad 45*a* of the second insulating layer 41.

Further, the semiconductor chip 2 further includes a second contact electrode 44*b* that penetrates the second insulating layer 41 and electrically connects the first electrode 39*b* (the anode side of the infrared photoelectric conversion element PDI) of the second semiconductor layer 31 and the element-side second metal pad 45*b* of the second insulating layer 41.

Furthermore, the semiconductor chip 2 further includes a third contact electrode 44*c* that penetrates the first insulating layer 25 and the second insulating layer 41 and electrically connects the gate electrode 24 of the transfer transistor TRG1 of the first semiconductor layer 21 and the element-side third metal pad 45*c* of the second insulating layer 41.

Further, as illustrated in FIG. 5B, the semiconductor chip 2 further includes a fourth contact electrode 44*d* that penetrates the second insulating layer 41 and electrically connects the lead-out electrode 39*d* (the cathode side of the infrared photoelectric conversion element PDI) of the second semiconductor layer 31 and the element-side fourth metal pad 45*d* of the second insulating layer 41.

Furthermore, although not illustrated in detail, the semiconductor chip 2 further includes a fifth contact electrode that penetrates the first insulating layer 25 and the second insulating layer 41 and electrically connects the cathode side of the visible light photoelectric conversion element PDU of the first semiconductor layer 21 and the element-side fifth metal pad 45*e* (see FIG. 3) of the second insulating layer 41.

As illustrated in FIG. 5A, the first contact electrode 44*a* is embedded in a connection hole that penetrates the second insulating layer 41, the second semiconductor layer 31, the second electrode 35, the first insulating layer 25, and the like from a bottom surface of the element-side first metal pad 45*a* on the second semiconductor layer 31 side and reaches a surface of the charge holding region FD of the first semiconductor layer 21. Although not illustrated in detail, the first contact electrode 44a is electrically separated from the second semiconductor layer 31 and the second electrode 35 via an insulating film provided on respective side walls of the second semiconductor layer 31 and the second electrode 35 in the connection hole.

One end side of the first contact electrode 44a is electrically and mechanically connected to the charge holding region FD of the first semiconductor layer 21. Then, the charge holding region FD is electrically connected to the anode side of the visible light photoelectric conversion element PDU when the transfer transistor TRG1 is turned on.

The other end side of the first contact electrode 44a is electrically and mechanically connected to the element-side first metal pad 45a. Then, the element-side first metal pad 45a is bonded to the circuit-side first metal pad 65a of the circuit substrate unit 50 and is electrically and mechanically connected thereto. Then, the circuit-side first metal pad 65a is electrically connected to the gate electrode 52 of the amplification transistor AMP1 constituting the first readout circuit 15 via the first wiring path 64a of the multilayer wiring layer 61.

Therefore, the charge holding region FD of the first semiconductor layer 21 is electrically connected to the first readout circuit 15 of the circuit substrate unit 50 via a first conductive path including the first contact electrode 44a, the element-side first metal pad 45a, the circuit-side first metal pad 65a, and the first wiring path 64a.

As illustrated in FIG. 5A, the second contact electrode 44b is embedded in a connection hole that penetrates the second insulating layer 41 and the like from a bottom surface of the element-side second metal pad 45b on the second semiconductor layer 31 side and reaches a surface of the first electrode 39b.

One end side of the second contact electrode 44b is electrically and mechanically connected to the first electrode 39b on the anode side of the infrared photoelectric conversion element PDI. Then, the first electrode 39 is electrically connected to the photoelectric conversion layer 33 via the contact region 38.

The other end side of the second contact electrode 44b is electrically and mechanically connected to the element-side second metal pad 45b. Then, the element-side second metal pad 45b is bonded to the circuit-side second metal pad 65b of the circuit substrate unit 50. Then, the circuit-side second metal pad 65b is electrically connected to the one main electrode region of the transfer transistor TRG2 constituting the second readout circuit 16 via the second wiring path 64b of the multilayer wiring layer 61.

Therefore, the infrared photoelectric conversion element PDI of the second semiconductor layer 31 is electrically connected to the second readout circuit 16 of the circuit substrate unit 50 via a second conductive path including the contact region 38, the first electrode 39b, the second contact electrode 44b, the element-side second metal pad 45b, the circuit-side second metal pad 65b, and the second wiring path 64b.

As illustrated in FIG. 5A, the third contact electrode 44c is embedded in a connection hole that penetrates the second insulating layer 41, the second semiconductor layer 31, the second electrode 35, the first insulating layer 25, and the like from a bottom surface of the element-side third metal pad 45c on the second semiconductor layer 31 side and reaches a surface of the gate electrode 24 of the transfer transistor TRG1. Although not illustrated in detail, the third contact electrode 44c is electrically separated from the second semiconductor layer 31 and the second electrode 35 via an insulating film provided on respective side walls of the second semiconductor layer 31 and the second electrode 35 in the connection hole.

One end side of the third contact electrode 44c is electrically and mechanically connected to the gate electrode 24 of the transfer transistor TRG1 provided in the first semiconductor layer 21.

The other end side of the third contact electrode 44c is electrically and mechanically connected to the element-side third metal pad 45c. Then, the element-side third metal pad 45c is bonded to the circuit-side third metal pad 65c of the circuit substrate unit 50. Then, the circuit-side first metal pad 65c is electrically connected to the first transfer transistor drive wiring of the pixel drive line 10 via the third wiring path 64c of the multilayer wiring layer 61.

Therefore, the gate electrode 24 of the transfer transistor TRG1 provided in the first semiconductor layer 21 is electrically connected to the logic circuit 13 of the circuit substrate unit 50 via a third conductive path including the third contact electrode 44c, the element-side third metal pad 45c, the circuit-side third metal pad 65c, and the third wiring path 64c.

As illustrated in FIGS. 4 and 5A, each of the first contact electrode 44a, the second contact electrode 44b, and the third contact electrode 44c is disposed in the pixel region 2A in plan view, and extends along the thickness direction (Z direction) of each of the first insulating layer 25 and the second insulating layer 41. Then, each of the first to third contact electrodes 44a to 44c is provided for every pixel 3.

As illustrated in FIG. 5B, the fourth contact electrode 44d is embedded in a connection hole that penetrates the second insulating layer 41 from a bottom surface of the element-side fourth metal pad 45d on the second semiconductor layer 31 side and reaches a surface of the lead-out electrode 39d. Although not illustrated in detail, the fourth contact electrode 44d is electrically separated from the cap layer 32 and the photoelectric conversion layer 33 via an insulating film provided on respective side walls of the cap layer 32 and the photoelectric conversion layer 33 in the connection hole.

One end side of the fourth contact electrode 44d is electrically and mechanically connected to the lead-out electrode 39d. Then, the lead-out electrode 39d is electrically connected to the second electrode 35 provided on the second surface 31y (light incident surface) side of the second semiconductor layer 31 as the cathode side of the infrared photoelectric conversion element PDI. Then, the second electrode 35 is electrically connected to the photoelectric conversion layer 33 via the contact layer 34.

Therefore, the cathode side of the infrared photoelectric conversion element PDI is electrically connected to the reference potential wiring V4 (see FIG. 3) of the circuit substrate unit 50 via a fourth conductive path including the contact layer 34, the second electrode 35, the lead-out electrode 39d, the fourth contact electrode 44d, the fourth element-side metal pad 45d, the fourth circuit-side metal pad 65d, and the fourth wiring path 64d.

The fourth contact electrode 44d is disposed in the pixel region 2A in plan view and extends along the thickness direction (Z direction) of each of the second insulating layers 41.

Note that the fifth contact electrode electrically connecting the cathode side of the visible light photoelectric conversion element PDU provided on the first semiconductor layer 21 and the element-side fifth metal pad 45e (see FIG. 3) of the second insulating layer 41 is not illustrated, and thus the description of a fifth conductive path including the fifth contact electrode will be omitted.

As each of the first to fourth contact electrodes 44*a* to 44*d* and the fifth contact electrode, a high melting point metal material such as titanium (Ti), tungsten (W), cobalt (Co), or molybdenum (Mo) can be used, and for example, tungsten (W) is used.

<<Method of Manufacturing Solid-State Imaging Device>> Next, a method of manufacturing the solid-state imaging device 1A according to the first embodiment will be described with reference to FIGS. 6A, 6B, 7A, 7B, 7C, 7D, 7E 7F, 7G, 7H, 7I, and 7J.

Figure 6A:
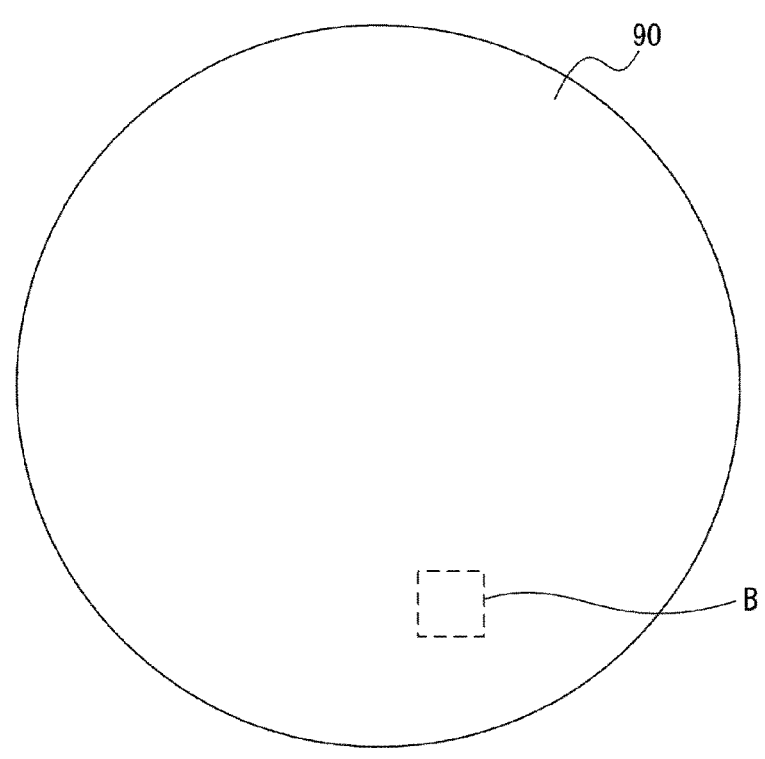
FIG. 6A is a view illustrating a planar configuration of a wafer.
Figure 6B:
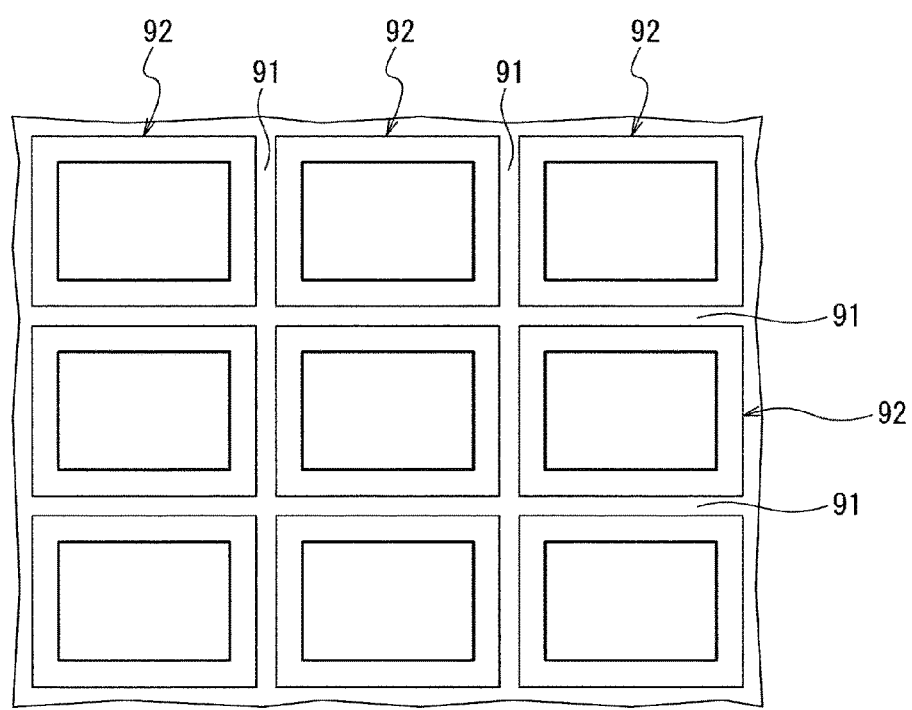
FIG. 6B is a view illustrating a configuration of a chip forming region by enlarging a region B in FIG. 7A.

FIG. 6A is a view illustrating a planar configuration of a wafer, and FIG. 6B is a view illustrating a configuration of a chip forming region by enlarging a region B in FIG. 6A.

Furthermore, FIGS. 7A, 7B, 7C, 7D, 7E, 7F, 7G, 7H, 7I, and 7J are schematic cross-sectional views for describing a method of manufacturing the solid-state imaging device 1A.

Here, as illustrated in FIGS. 6A and 6B, the solid-state imaging device 1A is manufactured in a chip forming region 92 of a semiconductor wafer 90. The chip forming region 92 is partitioned by scribe lines 91, and a plurality of chip forming regions is arranged in a matrix. In FIG. 6B, nine chip forming regions 92 are illustrated. Then, the plurality of chip forming regions 92 is diced along the scribe lines 91 to form the semiconductor chip 2 on which the solid-state imaging device 1A is mounted. The chip forming region 92 is diced after the solid-state imaging device 1A is formed in each chip forming region 92 by performing a manufacturing process described below.

Note that the scribe lines 91 are not physically formed.

Figure 7A:
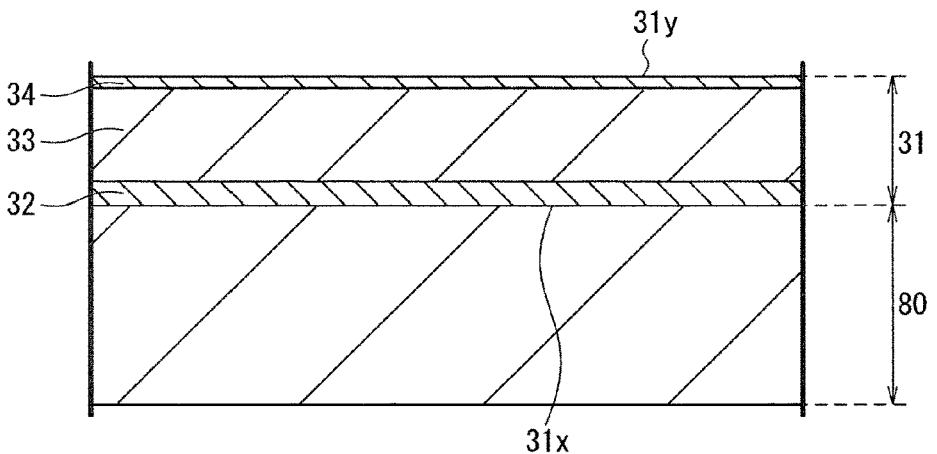
FIG. 7A is a schematic process cross-sectional view illustrating a method of manufacturing the solid-state imaging device according to the first embodiment of the present technology.
Figure 7B:
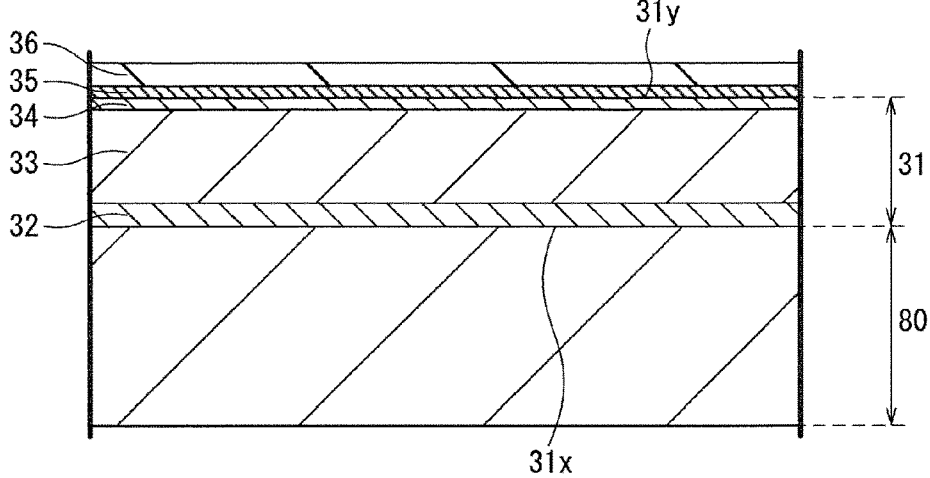
FIG. 7B is a schematic process cross-sectional view following FIG. 7A.
Figure 7C:
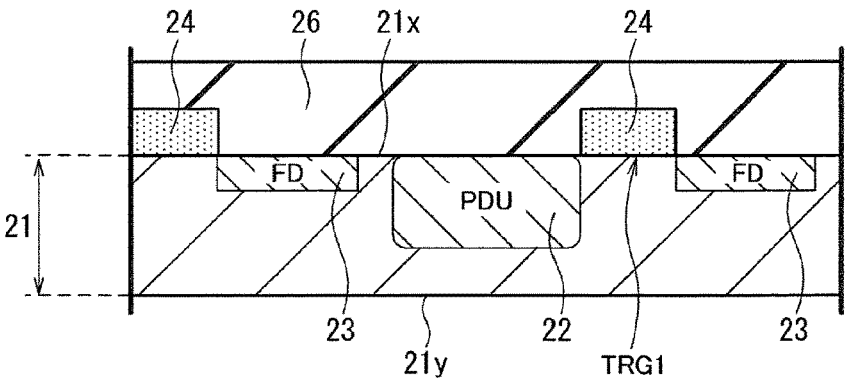
FIG. 7C is a schematic process cross-sectional view following FIG. 7B.
Figure 7D:
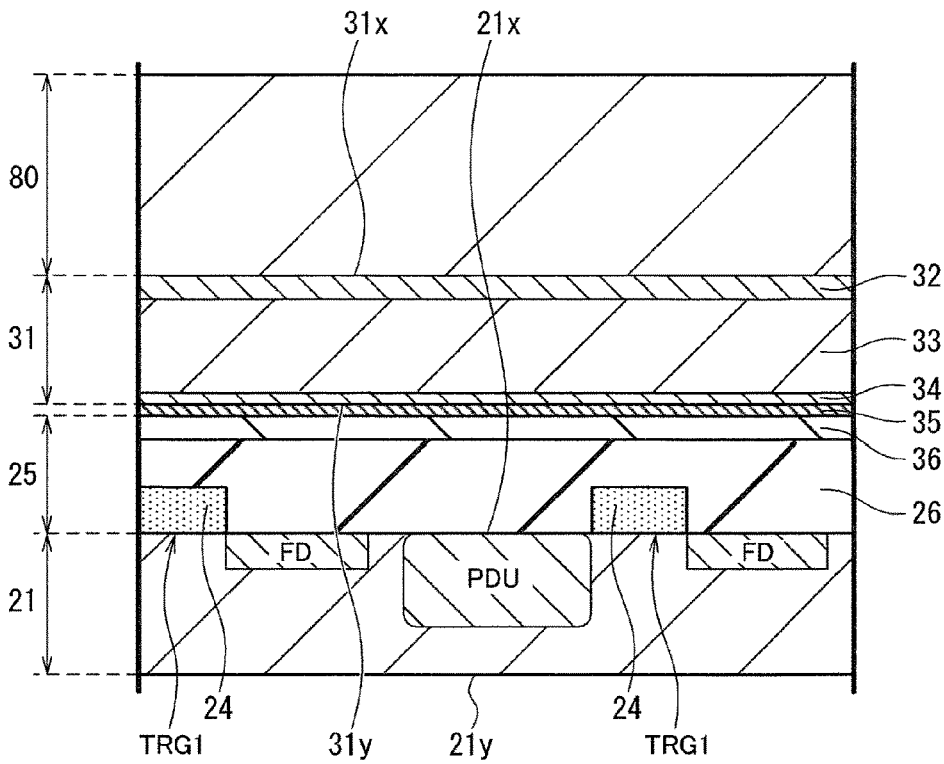
FIG. 7D is a schematic process cross-sectional view following FIG. 7C.
Figure 7E:
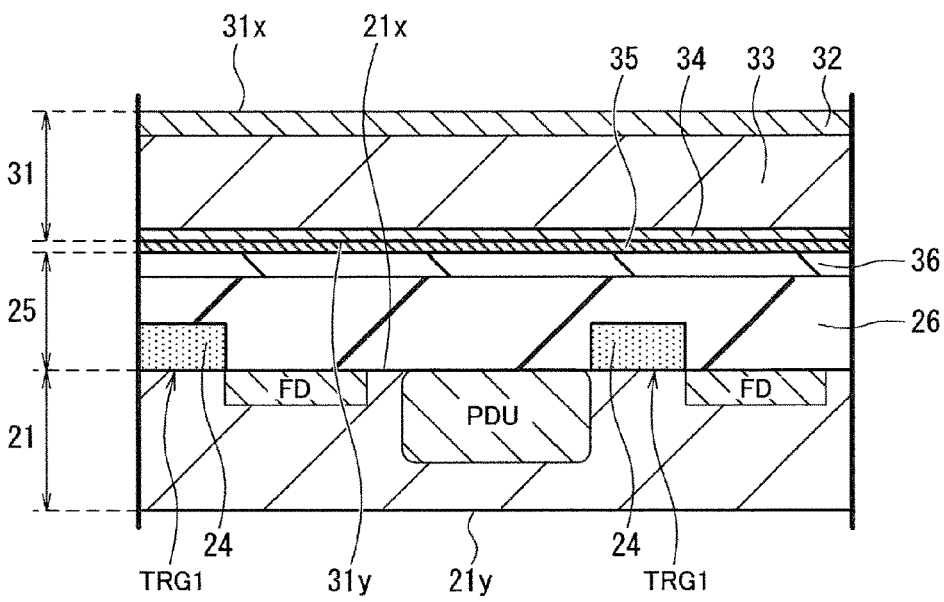
FIG. 7E is a schematic process cross-sectional view following FIG. 7D.
Figure 7F:
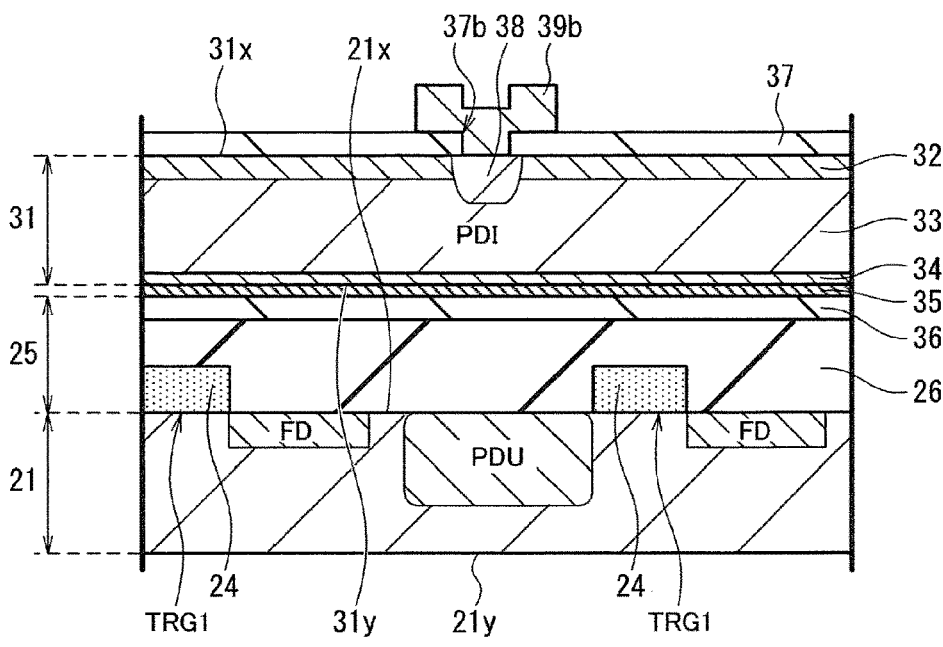
FIG. 7F is a schematic process cross-sectional view following FIG. 7E.
Figure 7G:
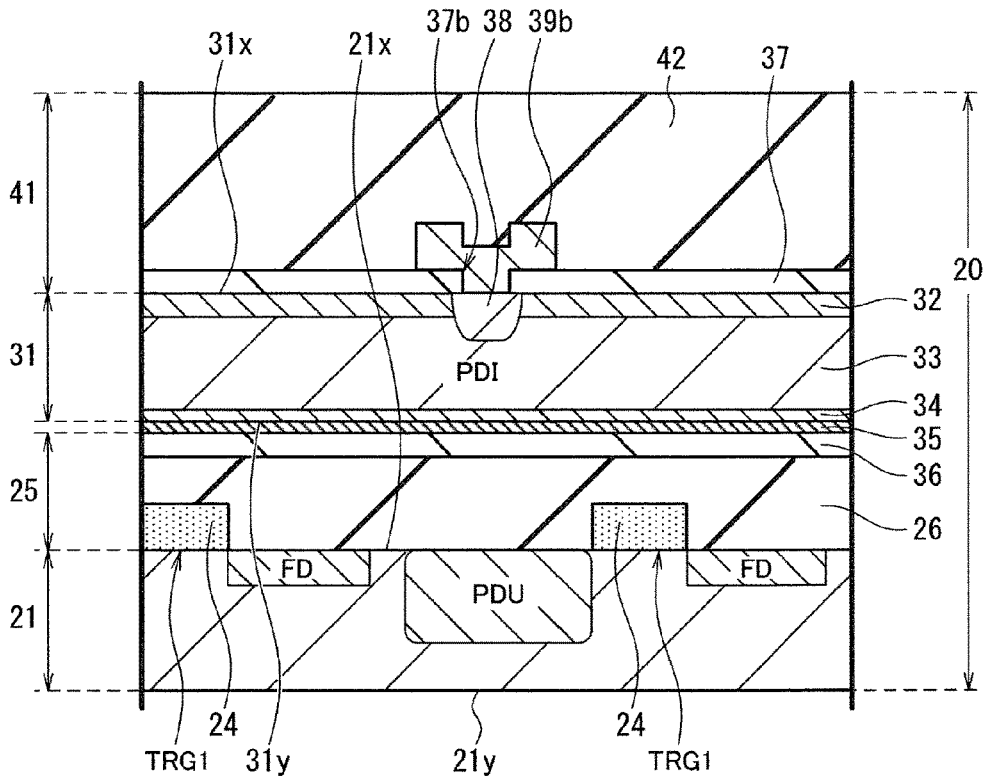
FIG. 7G is a schematic process cross-sectional view following FIG. 7F.
Figure 7H:
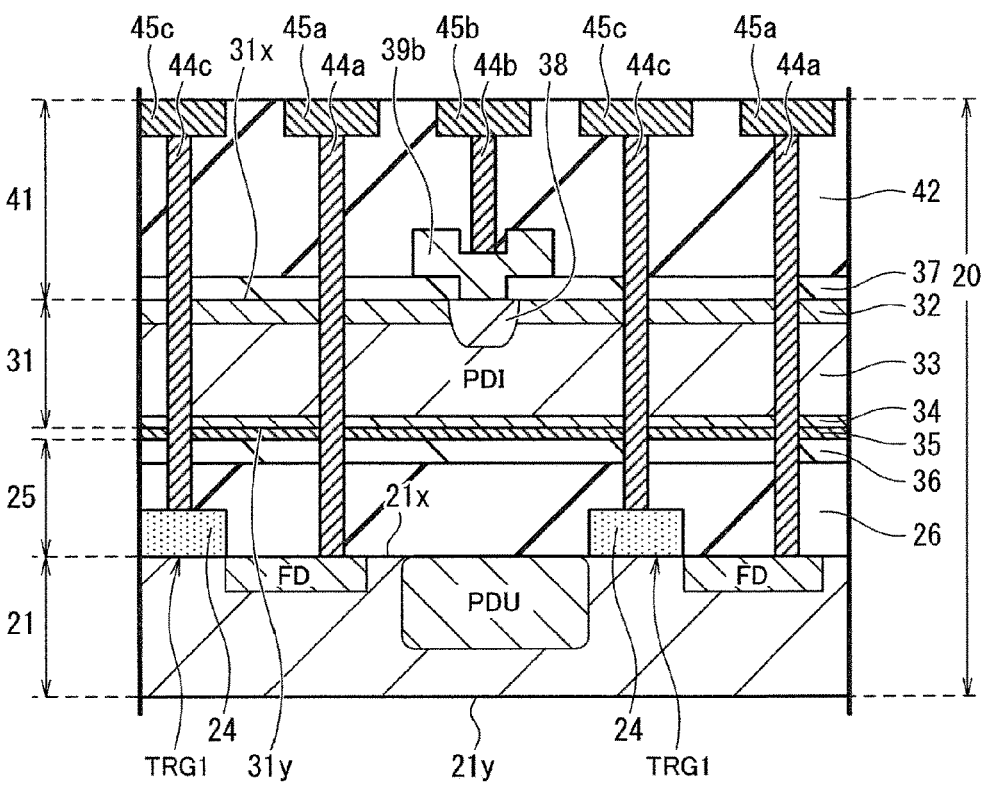
FIG. 7H is a schematic process cross-sectional view following FIG. 7G.
Figure 7I:
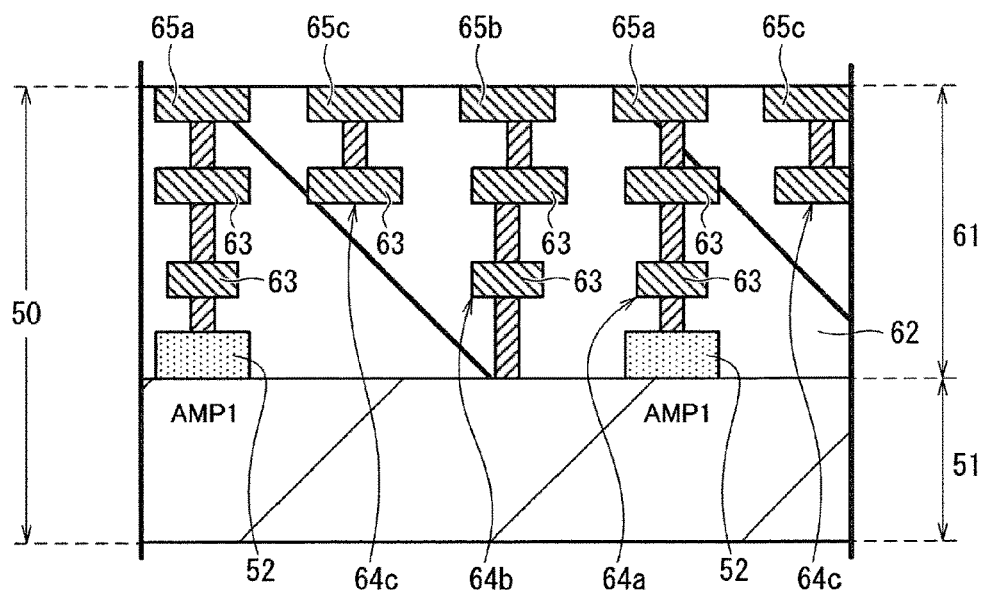
FIG. 7I is a schematic process cross-sectional view following FIG. 7H.

The method of manufacturing the solid-state imaging device 1A according to the first embodiment includes a step of forming the photoelectric conversion substrate unit 20 illustrated in FIG. 7H and a step of forming the circuit substrate unit 50 illustrated in FIG. 7I. Either the photoelectric conversion substrate unit 20 or the circuit substrate unit 50 may be formed first, or may be formed in the same process. In the first embodiment, the formation of the photoelectric conversion substrate unit 20 will be described first, but the order of forming the photoelectric conversion substrate unit 20 and the circuit substrate unit 50 is not limited to the first embodiment.

First, as illustrated in FIG. 7A, the second semiconductor layer 31 containing a compound semiconductor material is formed on a growth substrate 80. The second semiconductor layer 31 is formed by sequentially epitaxially growing the cap layer 32 including n-type InP, the photoelectric conversion layer 33 including i-type InGaAs, and the contact layer 34 including n-type InP in this order on a growth substrate 80 including InP, for example. The thickness of the growth substrate 80 is, for example, several hundred μm, and the thickness of the second semiconductor layer 31 is, for example, several μm. As the growth substrate 80, for example, one having a size equal to that of the semiconductor wafer 90 illustrated in FIG. 6A is used. In the second semiconductor layer 31, a surface on the growth substrate 80 side is the first surface 31*x*, and a surface opposite to the first surface 31*x* is the second surface 31*y*.

Next, after the second semiconductor layer 31 is formed, as illustrated in FIG. 7B, the second electrode 35 in contact with the contact layer 34 is formed on the contact layer 34 side (second surface 31*y* side) of the second semiconductor layer 31, and subsequently, the protective film 36 covering the second electrode 35 is formed on the side of the second electrode 35 opposite to the contact layer 34 side. The second electrode 35 is formed by, for example, forming a transparent conductive film of indium tin oxide (ITO), ITiO (In$_2$O$_3$—TiO$_2$), or the like by a sputtering method. The protective film 36 is formed by, for example, forming a silicon oxide film by a chemical vapor deposition (CVD) method.

Next, as illustrated in FIG. 7C, the visible light photoelectric conversion element PDU (photoelectric conversion unit 22), the transfer transistor TRG1, the charge holding region FD, and the like are formed on the first surface 21*x* side of the first semiconductor layer 21 different from the second semiconductor layer 31, and subsequently, the insulating film 26 covering the visible light photoelectric conversion element PDU, the transfer transistor TRG1, the charge holding region FD, and the like is formed on the first surface 21*x* side of the first semiconductor layer 21. As the first semiconductor layer 21, for example, a p-type silicon substrate containing a silicon material can be used. As the insulating film 26, for example, a silicon oxide film deposited by a CVD method can be used. Since the formation of the photoelectric conversion unit 22, the transfer transistor TRG1, the charge holding region FD, the insulating film 26, and so on are performed in the first semiconductor layer 21 different from the second semiconductor layer 31, the formation may be performed before the step of forming the second semiconductor layer 31 described above or the step of forming the second electrode 35 and the protective film 36, or may be performed in the same process.

Next, as illustrated in FIG. 7D, the first semiconductor layer 21 and the second semiconductor layer 31 are bonded together. The first semiconductor layer 21 and the second semiconductor layer 31 are bonded to each other in a state where the insulating film 26 on the first surface 21*x* side of the first semiconductor layer 21 and the protective film 36 on the second surface 31*y* side of the second semiconductor layer 31 face each other. That is, the first semiconductor layer 21 and the second semiconductor layer 31 are bonded by bonding the insulating film 26 and the protective film 36. This bonding may be performed by an adhesive or by plasma bonding.

Through this bonding process, the first insulating layer 25 including the insulating film 26 and the protective film 36 is formed between the first surface 21*x* side of the first semiconductor layer 21 and the second surface 31*y* side of the second semiconductor layer 31.

Next, after the first semiconductor layer 21 and the second semiconductor layer 31 are bonded together, the growth substrate 80 is removed as illustrated in FIG. 7E. Removal of the growth substrate 80 can be performed by mechanical grinding, CMP, wet etching, dry etching, or the like. By the step of removing the growth substrate 80, the surface of the cap layer 32 on the first surface 31*x* side of the second semiconductor layer 31 is exposed. Furthermore, the second semiconductor layer 31 is held by the first semiconductor layer 21 via the first insulating layer 25.

Here, although not illustrated, the manufacturing of the photoelectric conversion substrate unit 20 may or may not include a step of dicing the second semiconductor layer 31 into pieces having a predetermined chip size corresponding to the chip forming region 92 illustrated in FIG. 6B. The first embodiment includes a dicing step of dicing the second semiconductor layer 31 into pieces having a predetermined chip size. The dicing of the second semiconductor layer 31 can be performed using a known photolithography technique and dry etching technique. By performing this dicing step, the second semiconductor layer 31 having a plane size smaller than the plane size of the first semiconductor layer 21 can be formed with reference to FIGS. 1B and 5B.

Next, after the dicing step is performed, as illustrated in FIG. 7F, the insulating film 37 is formed on the entire surface of the first insulating layer 25 on the second semiconductor layer 31 side, so as to cover the second semiconductor layer 31. The insulating film 37 is formed by, for example, forming a silicon oxide film by a CVD method.

In this step, referring to FIG. 5B, the first surface 31x and the side surface of the second semiconductor layer 31 are covered with the insulating film 37. Furthermore, the insulating film 26 outside the second semiconductor layer 31 in plan view, in other words, the insulating film 26 exposed from the second semiconductor layer 31 is also covered with the insulating film 37.

Next, after the insulating film 37 is formed, the contact region 38 and the first electrode 39b are formed as illustrated in FIG. 7F. The contact region 38 can be formed by forming the opening 37b in the insulating film 37, ion-implanting impurities into a surface layer portion on the first surface 31x side of the second semiconductor layer 31 through the opening 37b, and then performing heat treatment to activate the impurities. The contact region 38 is preferably formed at a depth protruding from the cap layer 32 toward the photoelectric conversion layer 33 side.

The first electrode 39b can be formed by forming a conductive film on the entire surface of the insulating film 37 including the inside of the opening 37b of the insulating film 37 and then patterning the conductive film. As the conductive film, for example, a conductive film formed by a stacked film of titanium and tungsten and having a film thickness of about several tens nm to several hundreds nm can be used.

Here, although not illustrated, the manufacturing of the photoelectric conversion substrate unit 20 includes a step of forming the lead-out electrode 39d illustrated in FIG. 5B. The lead-out electrode 39d can be formed by forming a connection hole 37d that penetrates the second semiconductor layer 31 from the surface of the insulating film 37 and reaches the second electrode 35, then forming a conductive film on the entire surface of the insulating film 37 including the inside of the connection hole 37d, and then patterning the conductive film. In the first embodiment, the lead-out electrode 39d is formed in the same step as the first electrode 39b. That is, the opening 37b and the connection hole 37d are formed, subsequently, a conductive film is formed, and then the conductive film is patterned to form the first electrode 39b and the lead-out electrode 39d. As the conductive film, for example, a stacked film of titanium (Ti)/ tungsten (W) can be used. The stacked film can be formed by a CVD method, a physical vapor deposition (PVD) method, an atomic layer deposition (ALD) method, a vapor deposition method, or the like.

Next, as illustrated in FIG. 7G, the insulating film (embedded film) 42 covering the second semiconductor layer 31 is formed on the entire surface of the first insulating layer 25 on the second semiconductor layer 31 side. In the first embodiment, the second semiconductor layer 31 is diced into pieces having a predetermined chip size. Therefore, the insulating film 42 is formed by forming an insulating material on the second semiconductor layer 31 side of the first insulating layer 25 so as to embed the second semiconductor layer 31, and then planarizing the insulating material by a chemical mechanical polishing (CMP) method. Thus, referring to FIG. 5B, the insulating film 42 covering a periphery of the second semiconductor layer 31 and the first surface 31x side of the second semiconductor layer 31 is formed, and the step between the second semiconductor layer 31 and the first insulating layer 25 is filled with the insulating film 42.

In this way, since the insulating film 42 is formed to fill the step between the second semiconductor layer 31 and the first insulating layer 25, the occurrence of defects in the manufacturing process due to the step thereof can be prevented. As the insulating film 42, it is preferable to use an insulating material having high fluidity due to heat treatment and capable of withstanding stress at the time of polishing the element-side metal pad. Examples of such an insulating material include phosphorus-containing silicon oxide (phosphorus silicate glass (PSG)).

Through this process, the first electrode 39b and the lead-out electrode 39d are covered with the insulating film 42. Furthermore, the second insulating layer 41 including the insulating film 42 and the insulating film 37 is formed on the side of the second semiconductor layer 31 opposite to the first semiconductor layer 21 side.

Next, as illustrated in FIG. 7H, the first contact electrode 44a, the second contact electrode 44b, and the third contact electrode 44c are formed as contact electrodes, and the element-side first metal pad 45a, the element-side second metal pad 45b, and the element-side third metal pad 45c are formed as element-side metal pads.

The first contact electrode 44a can be formed by forming a connection hole that penetrates the second insulating layer 41, the second semiconductor layer 31, the first insulating layer 25, and the like from the surface layer portion of the second insulating layer 41 on the side opposite to the second semiconductor layer 31 and reaches the surface of the charge holding region FD, and embedding a conductive material in the connection hole. Then, the element-side first metal pad 45a can be formed by forming a recess communicating with the connection hole of the first contact electrode 44a in the surface layer portion of the second insulating layer 41 and embedding a conductive material in the recess.

Similarly, the second contact electrode 44b can be formed by forming a connection hole that penetrates the second insulating layer 41 from the surface layer portion of the second insulating layer 41 on the side opposite to the second semiconductor layer 31 and reaches the surface of the first electrode 39b and embedding a conductive material in the connection hole. Then, the element-side second metal pad 45b can be formed by forming a recess communicating with the connection hole of the second contact electrode 44b in the surface layer portion of the second insulating layer 41 and embedding a conductive material in the recess.

Similarly, the third contact electrode 44c can be formed by forming a connection hole that penetrates the second insulating layer 41, the second semiconductor layer 31, the first insulating layer 25, and the like from the surface layer portion of the second insulating layer 41 on the side opposite to the second semiconductor layer 31 and reaches the surface of the gate electrode 24 of the transfer transistor TRG1, and embedding a conductive material in the connection hole. Then, the element-side third metal pad 45c can be formed by forming a recess communicating with the connection hole of the third contact electrode 44c in the surface layer portion of the second insulating layer 41 and embedding a conductive material in the recess.

Each of the contact electrodes 44a, 44b, and 44c is formed in the same process. Each of the element-side metal pads 45a, 45b, and 45c is formed in the same process. Each of the contact electrodes 44a, 44b, and 44c may be formed separately from each of the element-side metal pads 45a, 45b, and 45c, or may be integrally formed using a damascene method. In the first embodiment, the contact electrodes 44a, 44b, and 44c and the element-side metal pads 45a, 45b, and 45c are formed separately.

Note that the fourth contact electrode 44d illustrated in FIG. 5B and the fifth contact electrode, which is not illustrated, are formed in the same process as the process of forming the contact electrodes 44a, 44b, and 44c, and the element-side fourth metal pad 45d illustrated in FIG. 5B and the element-side fifth metal pad 45e illustrated in FIG. 3 are formed in the same process as the process of forming the metal pads 45a, 45b, and 45c.

In addition, since the contact electrodes 44b and 44d are shorter in length than the contact electrodes 44a and 44c, the contact electrodes 44b and 44d and the contact electrodes 44a and 44c may be formed in separate processes.

Through this process, the photoelectric conversion substrate unit 20 including the first semiconductor layer 21, the visible light photoelectric conversion element PDU, the transfer transistor TRG1, the charge holding region FD, the first insulating layer 25, the second semiconductor layer 31, the infrared photoelectric conversion element PDI, the second insulating layer 41, the contact electrodes 44a to 44e, the element-side metal pads 45a to 45e, and the like is formed.

Next, manufacturing of the circuit substrate unit 50 will be described with reference to FIG. 7I.

The manufacturing of the circuit substrate unit 50 illustrated in FIG. 7I includes a step of forming transistors constituting the logic circuit, active elements (AMP1, SEL1, and TST1) constituting the first readout circuit 15, and active elements (TRG2, RST2, OFG, AMP2, and SEL2), the capacitor elements (17a and 17b), and the like constituting the second readout circuit 16 on the first surface side of the semiconductor substrate 51. Furthermore, the manufacturing of the circuit substrate unit 50 includes a step of forming the multilayer wiring layer 61 on the first surface of the semiconductor substrate 51. The multilayer wiring layer 61 includes the interlayer insulating film 62, a plurality of wiring layers stacked via the interlayer insulating film 62, the wiring 63 provided in each of the plurality of wiring layers, and contact electrodes electrically connecting the wirings 63 of different wiring layers. Furthermore, the multilayer wiring layer 61 includes the first to fifth wiring paths (64a, 64b, 64c, and 64d) including the wiring 63 and the contact electrodes, and circuit-side first to fifth metal pads (65a, 65b, and 65c) formed in the uppermost wiring layer. FIG. 7I does not illustrate the fourth and fifth wiring paths, the circuit-side fourth metal pad 65d, and the circuit-side fifth metal pad 65e.

Figure 7J:
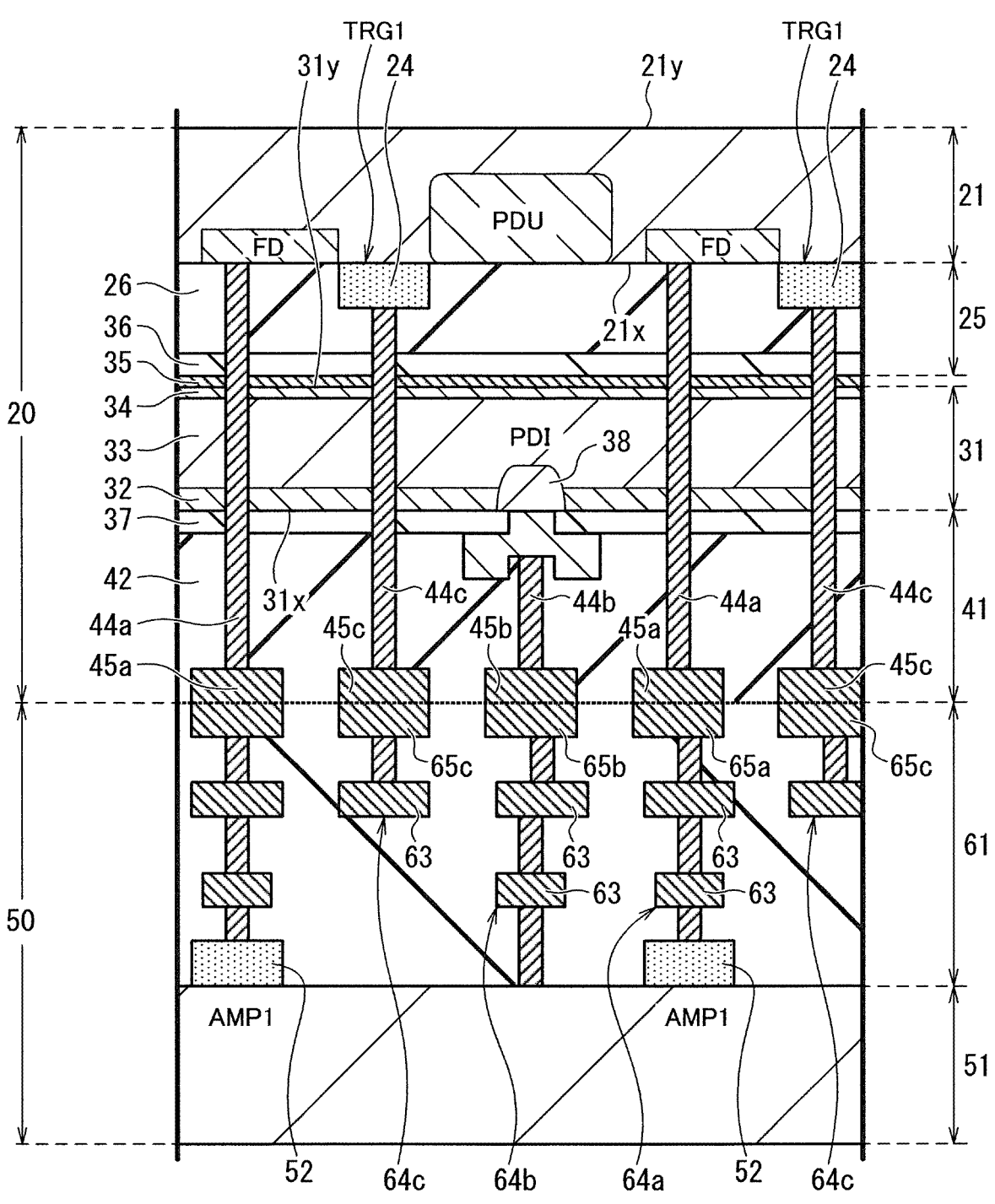
FIG. 7J is a schematic process cross-sectional view following FIG. 7I.

Next, as illustrated in FIG. 7J, the circuit substrate unit 50 and the photoelectric conversion substrate unit 20 are bonded together. The circuit substrate unit 50 and the photoelectric conversion substrate unit 20 are bonded to each other in a state where the circuit-side metal pads (65a to 65e) of the circuit substrate unit 50 and the element-side metal pads (45a to 45e) of the photoelectric conversion substrate unit 20 face each other. This bonding may be performed by an adhesive or by plasma bonding.

In this step, the circuit-side metal pads (65a to 65e) and the element-side metal pads (45a to 45e) are CuCu bonded. Then, the first conductive path electrically connecting the charge holding region FD of the photoelectric conversion substrate unit 20 and the first readout circuit 15 of the circuit substrate unit 50 is formed. Furthermore, the second conductive path electrically connecting the infrared photoelectric conversion element PDI of the photoelectric conversion substrate unit 20 and the second readout circuit 16 of the circuit substrate unit 50 is formed. Furthermore, the third conductive path electrically connecting the gate electrode 24 of the transfer transistor TRG1 of the photoelectric conversion substrate unit 20 and the logic circuit of the circuit substrate unit 50 is formed. Furthermore, the fourth conductive path electrically connecting the cathode side of the infrared photoelectric conversion element PDI of the photoelectric conversion substrate unit 20 and the power supply line of the circuit substrate unit 50 is formed. Furthermore, the fifth conductive path electrically connecting the cathode side of the visible light photoelectric conversion element of the photoelectric conversion substrate unit 20 and the reference potential wiring V7 of the circuit substrate unit is formed.

In addition, by this process, the semiconductor wafer 90 including the two different semiconductor layers 21 and 31 and the semiconductor substrate 51 is formed.

Next, the second surface 21y side of the first semiconductor layer 21 is ground and polished by, for example, a CMP method or the like to reduce the thickness of the first semiconductor layer 21. The thickness of the first semiconductor layer 21 before grinding and polishing is, for example, about 600 μm, but the first semiconductor layer 21 is thinned to a thickness of, for example, about 3 to 5 μm. The second surface 21y of the first semiconductor layer 21 is a light incident surface in the back-illuminated solid-state imaging device 1A.

Next, the insulating layer 71 including the light shielding films 72a and 72b, the color filter layer 73, and the microlens layer 74 are sequentially formed on the second surface 21y side of the first semiconductor layer 21.

Through this process, the solid-state imaging device 1A including the photoelectric conversion substrate unit 20 and the circuit substrate unit 50 is almost completed.

Furthermore, by this process, the semiconductor wafer 90 illustrated in FIGS. 6A and 6B is almost completed. The solid-state imaging device 1A is formed in each chip forming region 92 of the semiconductor wafer 90.

Thereafter, the plurality of chip forming regions 92 of the semiconductor wafer 90 is individually diced along the scribe lines 91, to thereby form the semiconductor chip 2 on which the solid-state imaging device 1A is mounted.

Effects of First Embodiment

Next, main effects of the first embodiment will be described.

A conventional solid-state imaging device is provided with a multilayer wiring layer between the first semiconductor layer 21 and the second semiconductor layer 31 when described with reference to the drawings of the present embodiment. Then, using the wiring of the multilayer wiring layer, the conductive path electrically connecting the charge holding region FD of the first semiconductor layer 21 and the first readout circuit 15 of the circuit substrate unit 50 is diverted (lead out) to the peripheral region 2B around the pixel region 2A.

In a case of such a structure, light incident from the light incident surface 21y side of the first semiconductor layer 21 and transmitted through the second semiconductor layer 31 is shielded by the wiring of the multilayer wiring layer, which causes a decrease in photosensitivity of the infrared photoelectric conversion element PDI provided in the second semiconductor layer 31.

On the other hand, as illustrated in FIG. 5A, the solid-state imaging device 1A according to the first embodiment includes the first contact electrode 44a that penetrates each of the first insulating layer 25, the second semiconductor layer 31, and the second insulating layer 41 and electrically connects the charge holding region FD of the first semiconductor layer 21 and the element-side first metal pad 45a. By forming the first conductive path that electrically connects the charge holding region FD of the first semiconductor layer 21 and the first readout circuit 15 of the circuit substrate unit 50 using the first contact electrode 44a, it is not necessary to divert the first conductive path to the peripheral region 2B as in the related art. Thus, it is possible to omit the wiring between the first semiconductor layer 21 and the second semiconductor layer 31, which is conventionally used to divert the conductive path. Therefore, with the solid-state imaging device 1A according to the first embodiment, it is possible to reduce a phenomenon in which light incident from the light incident surface 21y side of the first semiconductor layer 21 and transmitted through the first semiconductor layer 21 is shielded by the wiring, so that it is possible to improve the photosensitivity of the infrared photoelectric conversion element PDI.

Furthermore, as illustrated in FIG. 5A, the solid-state imaging device 1A according to the first embodiment includes the third contact electrode 44c that penetrates each of the first insulating layer 25, the second semiconductor layer 31, and the second insulating layer 41 and electrically connects the gate electrode 24 of the transfer transistor TRG1 of the first semiconductor layer 21 and the element-side third metal pad 45c. By forming the third conductive path electrically connecting the gate electrode 24 of the transfer transistor TRG1 of the first semiconductor layer 21 and the logic circuit 13 of the circuit substrate unit 50 using the third contact electrode 44c, it is not necessary to divert the third conductive path to the peripheral region 2B as in the related art, and thus the wiring between the first semiconductor layer 21 and the second semiconductor layer 31, which is conventionally used to divert the conductive path, can be omitted. Therefore, with the solid-state imaging device 1A according to the first embodiment, it is possible to reduce the phenomenon in which light incident from the light incident surface 21y side of the first semiconductor layer 21 and transmitted through the first semiconductor layer 21 is shielded by the wiring, so that it is possible to further improve the photosensitivity of the infrared photoelectric conversion element PDI.

Furthermore, as illustrated in FIG. 5B, the solid-state imaging device 1A according to the first embodiment includes the second electrode 35 provided on the first insulating layer 25 side of the second semiconductor layer 31, the lead-out electrode 39d provided on the second insulating layer 41 side of the second semiconductor layer 31, penetrating the second semiconductor layer 31 and electrically connected to the second electrode 35, and the fourth contact electrode 44d penetrating the second insulating layer 41 and electrically connecting the lead-out electrode 39d and the element-side fourth metal pad 45d. By forming the fourth conductive path electrically connecting the cathode side of the infrared photoelectric conversion element PDI of the photoelectric conversion substrate unit 20 and the reference potential wiring V4 of the circuit substrate unit 50 using the fourth contact electrode 44d, it is not necessary to divert the fourth conductive path to the peripheral region 2B as in the related art, and thus the wiring between the first semiconductor layer 21 and the second semiconductor layer 31 can be omitted. Therefore, with the solid-state imaging device 1A according to the first embodiment, it is possible to reduce the phenomenon in which light incident from the light incident surface 21y side of the first semiconductor layer 21 and transmitted through the first semiconductor layer 21 is shielded by the wiring, so that it is possible to further improve the photosensitivity of the infrared photoelectric conversion element PDI.

Furthermore, although not illustrated in detail, the solid-state imaging device 1A according to the first embodiment includes the fifth contact electrode that electrically connects the cathode side of the visible light photoelectric conversion element PDU provided in the first semiconductor layer 21 and the element-side fifth metal pad 45e (see FIG. 3) of the second insulating layer 41. By forming the fifth conductive path electrically connecting the cathode side of the visible light photoelectric conversion element PDI of the photoelectric conversion substrate unit 20 and the reference potential wiring V7 of the circuit substrate unit 50 using the fifth contact electrode, the wiring between the first semiconductor layer 21 and the second semiconductor layer 31 can be omitted. Therefore, with the solid-state imaging device 1A according to the first embodiment, it is possible to reduce the phenomenon in which light incident from the light incident surface 21y side of the first semiconductor layer 21 and transmitted through the first semiconductor layer 21 is shielded by the wiring, so that it is possible to improve the photosensitivity of the infrared photoelectric conversion element PDI.

Furthermore, the solid-state imaging device 1A according to the first embodiment includes the first contact electrode 44a, the second contact electrode 44b, the third contact electrode 44c, the fourth contact electrode 44d, and the contact electrode. Thus, as compared with a case where the conductive path is diverted to the peripheral region 2B as in the related art, the length of the conductive path electrically connecting the visible light photoelectric conversion element PDU and the infrared photoelectric conversion element PDI of the photoelectric conversion substrate unit 20 and the multilayer wiring layer 61 of the circuit substrate unit 50 can be shortened, so that the image processing of the solid-state imaging device 1A can be accelerated.

In the method of manufacturing the solid-state imaging device 1A according to the first embodiment, after the first semiconductor layer 21 and the second semiconductor layer are stacked, the infrared photoelectric conversion element PDI is formed in the second semiconductor layer 31 stacked on the first semiconductor layer 21. The infrared photoelectric conversion element PDI is formed using various masks such as an etching mask and an impurity introduction mask. A misalignment of these masks is smaller than a misalignment when the first semiconductor layer 21 and the second semiconductor layer are bonded. As compared with a case where the first semiconductor layer 21 in which the visible light photoelectric conversion element PDU is formed and the second semiconductor layer 31 in which the infrared photoelectric conversion element PDI is formed are bonded to each other as in the related art, a positional deviation between the visible light photoelectric conversion element and the infrared photoelectric conversion element can be minimized. Therefore, by the method of manufacturing the solid-state imaging device 1A according to the first embodiment, it is possible to provide the solid-state imaging device 1A with a high manufacturing yield.

Second Embodiment

Figure 8:
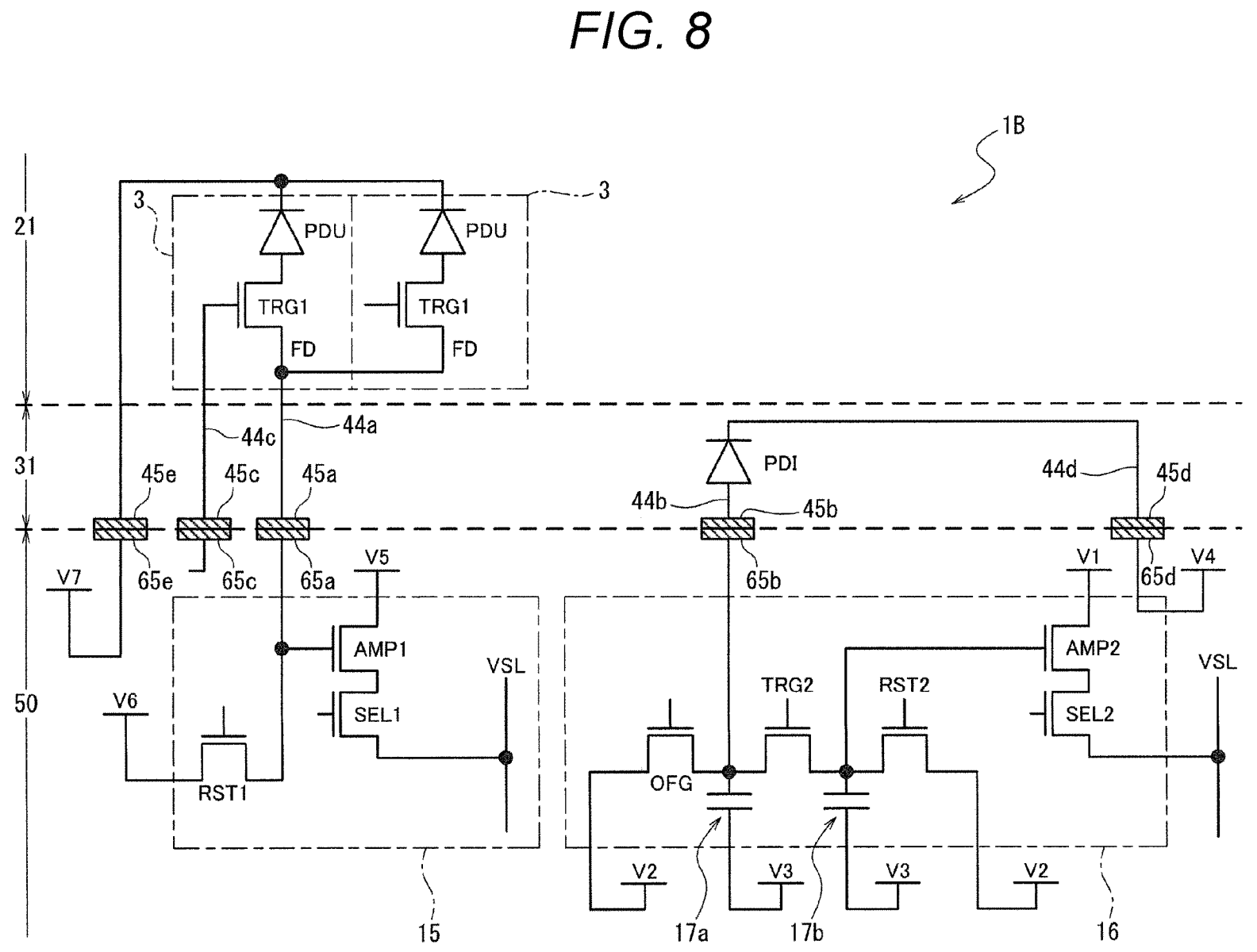

As illustrated in FIG. 8, a solid-state imaging device 1B according to a second embodiment of the present technology basically has a configuration similar to that of the solid-state imaging device 1A according to the first embodiment described above, and has the following configuration different therefrom.

That is, as illustrated in FIG. 3, in the solid-state imaging device 1A according to the first embodiment described above, one pixel 3 is connected to one first readout circuit 15.

On the other hand, as illustrated in FIG. 8, in the solid-state imaging device 1B according to the second embodiment, two pixels 3 are connected to one first readout circuit 15. That is, one first readout circuit 15 is shared by two pixels 3. Then, although not structurally illustrated, one first contact electrode 44a is shared by two pixels 3. One end side of the first contact electrode 44a is electrically connected to the charge holding region FD of each of the two pixels 3, and the other end side is electrically connected to the element-side first metal pad 45a. The other configurations are substantially similar to those of the first embodiment described above.

Also in the solid-state imaging device 1B according to the second embodiment, effects similar to those of the solid-state imaging device 1A according to the first embodiment described above can be obtained.

In addition, since the number of first contact electrodes 44a can be reduced as compared with the first embodiment, the photosensitivity can be further enhanced.

Note that, although not illustrated in detail in FIG. 8, the pixel 3 of the second embodiment also includes the infrared photoelectric conversion element PDI as does the pixel 3 of the first embodiment described above.

Furthermore, in the second embodiment, a case where one first readout circuit 15 is shared by two pixels 3 has been described, but the present technology can also be applied to a case where one first readout circuit 15 is shared by two or more pixels 3, that is, a plurality of pixels 3.

Third Embodiment

Figure 9:
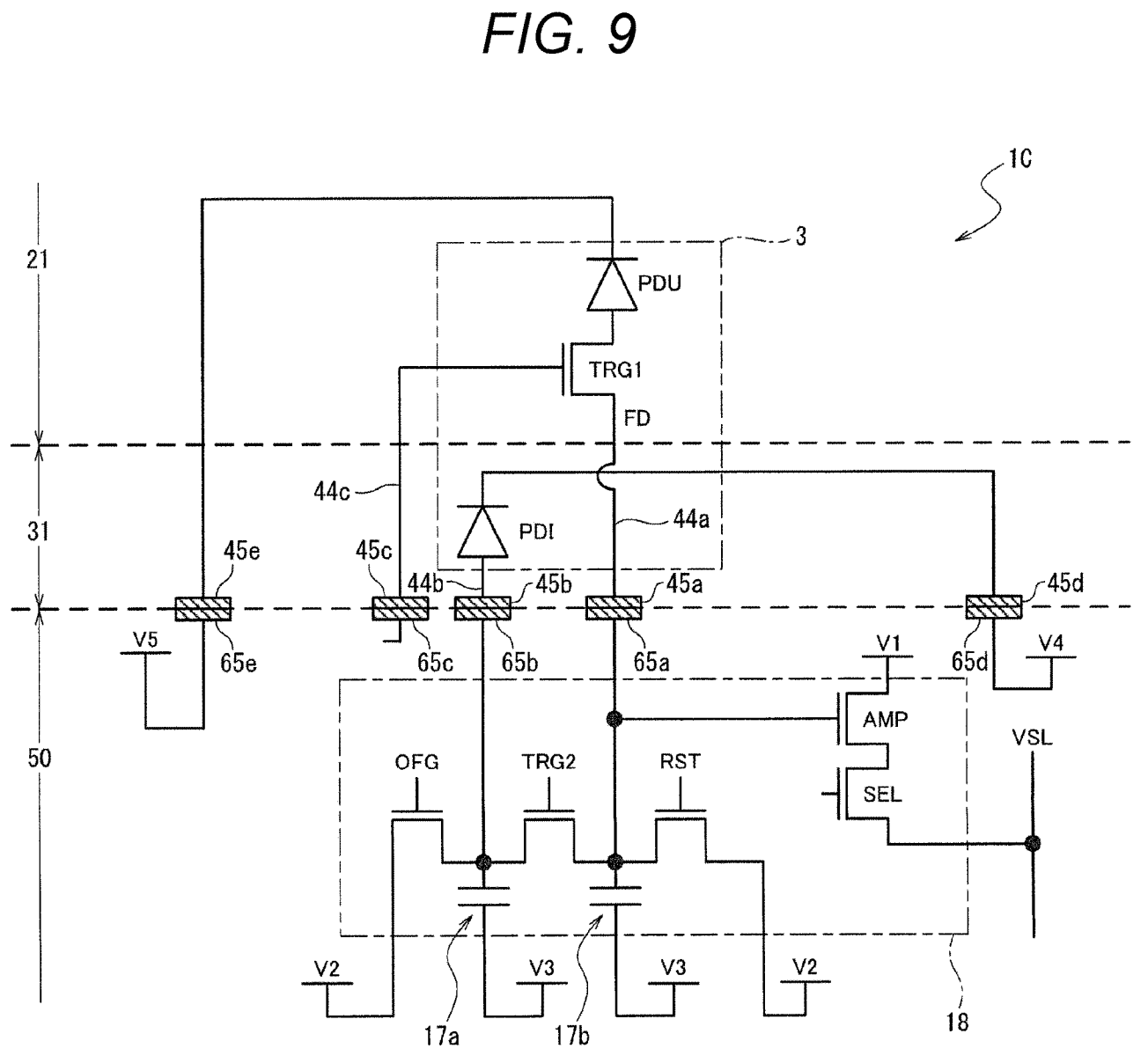

As illustrated in FIG. 9, a solid-state imaging device 1C according to a third embodiment of the present technology basically has a configuration similar to that of the solid-state imaging device 1A according to the first embodiment described above, and has the following configuration different therefrom.

That is, as illustrated in FIG. 3, the solid-state imaging device 1A according to the first embodiment described above individually includes the first readout circuit 15 that reads out signal charges photoelectrically converted by the visible light photoelectric conversion element PDU and the second readout circuit 16 that reads out signal charges photoelectrically converted by the infrared photoelectric conversion element PDI.

On the other hand, as illustrated in FIG. 9, the solid-state imaging device 1C according to the third embodiment includes a readout circuit 18 having a two-input configuration that reads out signal charges photoelectrically converted by the visible light photoelectric conversion element PDU and signal charges photoelectrically converted by the infrared photoelectric conversion element PDI. Other configurations are substantially similar to those of the first embodiment described above.

The readout circuit 18 outputs a pixel signal based on the signal charges output from the visible light photoelectric conversion element PDU of the pixel 3, and outputs a pixel signal based on the signal charges output from the infrared photoelectric conversion element PDI of the pixel 3.

As illustrated in FIG. 9, the readout circuit 18 includes the amplification transistor AMP and the selection transistor SEL. Furthermore, the readout circuit 18 includes the transfer transistor TRG2, the discharge transistor OFG, the reset transistor RST, and the two capacitor elements 17a and 17b.

In the transfer transistor TRG2, the one main electrode region is electrically connected to the anode side of the infrared photoelectric conversion element PDI, the one main electrode region of the discharge transistor OFG, and the one electrode of the capacitor element 17a, and the other main electrode region is electrically connected to one main electrode region of the reset transistor RST, the one electrode of the capacitor element 17b, a gate electrode of the amplification transistor AMP, and the charge holding region FD. Then, the gate electrode of the transfer transistor TRG2 is electrically connected to the second transfer transistor drive wiring of the pixel drive line 10.

In the discharge transistor OFG, one main electrode region is electrically connected to the one main electrode region of the transfer transistor TRG2, the anode region of the infrared photoelectric conversion element PDI, one electrode of the capacitor element 17a, and the other main electrode region is electrically connected to the power supply line V2. Then, the gate electrode of the discharge transistor OFG is electrically connected to the discharge transistor drive wiring of the pixel drive line 10.

In the reset transistor RST, one main electrode region is electrically connected to the other main electrode region of the transfer transistor TRG2, the gate electrode of the amplification transistor AMP, the charge holding region FD, and the one electrode of the capacitor element 17b, and the other main electrode region is electrically connected to the power supply line V2. Then, the gate electrode of the reset transistor RST is electrically connected to the reset transistor drive wiring of the pixel drive line 10.

In the amplification transistor AMP, one main electrode region is electrically connected to one main electrode region of the selection transistor SEL, and the other main electrode region is electrically connected to the power supply line V1. Then, the gate electrode of the amplification transistor AMP is electrically connected to the other main electrode region of the transfer transistor TRG2, one main electrode region of the reset transistor RST, the charge holding region FD, and the one electrode of the capacitor element 17b.

In the selection transistor SEL, one main electrode region is electrically connected to one main electrode region of the amplification transistor AMP, and the other main electrode region is electrically connected to the vertical signal line VSL (11). Then, the gate electrode of the selection transistor SEL is electrically connected to the selection transistor drive wiring of the pixel drive line 10.

The other electrode of the capacitor element 17a and the other electrode of the capacitor element 17b are electrically connected to the power supply line V3.

The capacitor element 17a temporarily holds (accumulates) the signal charge generated in the infrared photoelectric conversion element PDI. When the transfer transistor TRG2 is turned on, the transfer transistor TRG2 transfers the signal charge of the capacitor element 16a to the capacitor element 17b. The capacitor element 17b temporarily holds (accumulates) the signal charge transferred via the transfer transistor TRG2.

When the discharge transistor OFG is turned on, the discharge transistor OFG discharges the signal charge accumulated in the capacitor element 17a. When the reset transistor RST2 is turned on, the reset transistor RST2 resets the signal potential of the capacitor element 17b to the potential of the power supply line V2.

The amplification transistor AMP generates a signal of a voltage corresponding to the level of the signal charge held in the charge holding region FD as a pixel signal. The amplification transistor AMP constitutes a source follower type amplifier, and outputs a pixel signal having a voltage corresponding to the level of the signal charge generated in the visible light photoelectric conversion element PDU. When the selection transistor SEL is turned on, the amplification transistor AMP1 amplifies the signal charge of the charge holding region FD, and outputs a voltage corresponding to the signal charge to the column signal processing circuit 5 via the vertical signal line VSL (11). That is, the readout circuit 18 outputs a pixel signal based on the signal charge output from the visible light photoelectric conversion element PDU of the pixel 3.

Furthermore, the amplification transistor AMP generates a signal of a voltage corresponding to the level of the signal charge accumulated in the capacitor element 17*b* as a pixel signal. The amplification transistor AMP2 outputs a pixel signal having a voltage corresponding to the level of the signal charge generated in the infrared photoelectric conversion element PDI. When the selection transistor SEL is turned on, the amplification transistor AMP amplifies the signal charge of the capacitor element 17*b* and outputs a voltage corresponding to the signal charge to the column signal processing circuit 5 via the vertical signal line 11. That is, the readout circuit 18 outputs a pixel signal based on the signal charge output from the infrared photoelectric conversion element PDI of the pixel 3.

As described above, also in the solid-state imaging device 1C according to the third embodiment including the readout circuit 18 having the two-input configuration, effects similar to those of the solid-state imaging device 1A according to the first embodiment described above can be obtained.

Fourth Embodiment

Figure 10:
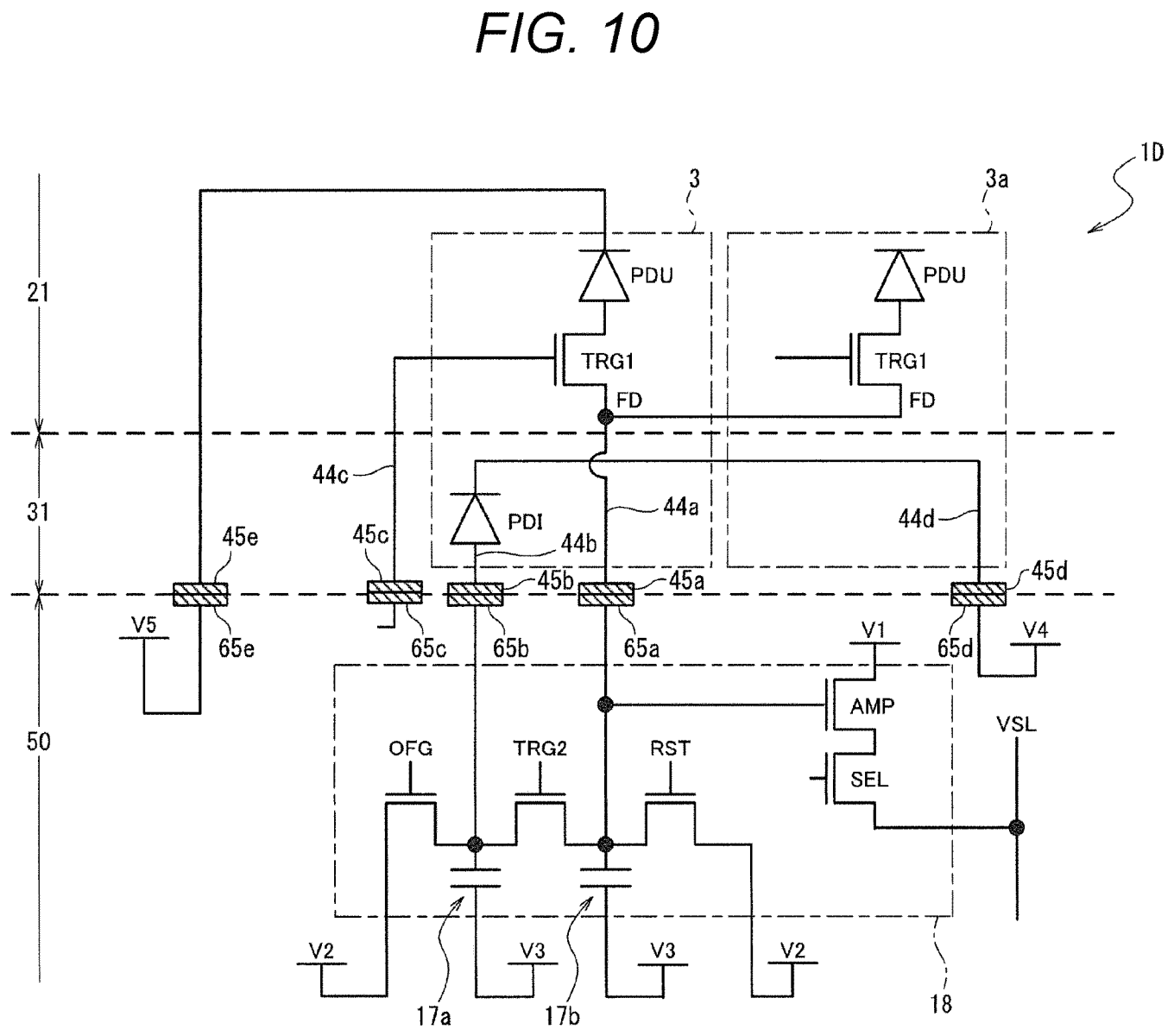

As illustrated in FIG. 10, a solid-state imaging device 1D according to a fourth embodiment of the present technology basically has a configuration similar to that of the solid-state imaging device 1C according to the third embodiment described above, and has the following configuration different therefrom.

That is, as illustrated in FIG. 9, in the solid-state imaging device 1C according to the third embodiment described above, one pixel 3 is connected to one readout circuit 18.

On the other hand, as illustrated in FIG. 10, in the solid-state imaging device 1D according to the fourth embodiment, the pixel 3 and the pixel 3*a* are connected to one readout circuit 18. Other configurations are substantially similar to those of the third embodiment described above.

As illustrated in FIG. 10, the pixel 3 includes the visible light photoelectric conversion element PDU, the transfer transistor TRG1 charge holding region FD, and the infrared photoelectric conversion element PDI. For the pixel 3, the pixel 3*a* includes the visible light photoelectric conversion element PDU, the transfer transistor TRG1, and the charge holding region FD, and does not include the infrared photoelectric conversion element PDI.

In the solid-state imaging device 1D according to the fourth embodiment, one readout circuit 18 is shared by two pixels 3 and 3*a*. Then, although not structurally illustrated, referring to FIG. 5A, one first contact electrode 44*a* is shared by two pixels 3 and 3*a*. One end side of the first contact electrode 44*a* is electrically connected to the charge holding region FD of each of the two pixels 3 and 3*a*, and the other end side is electrically connected to the element-side first metal pad 45*a*.

Also in the solid-state imaging device 1D according to the fourth embodiment, effects similar to those of the solid-state imaging device 1A according to the first embodiment described above can be obtained.

Fifth Embodiment

Figure 11:
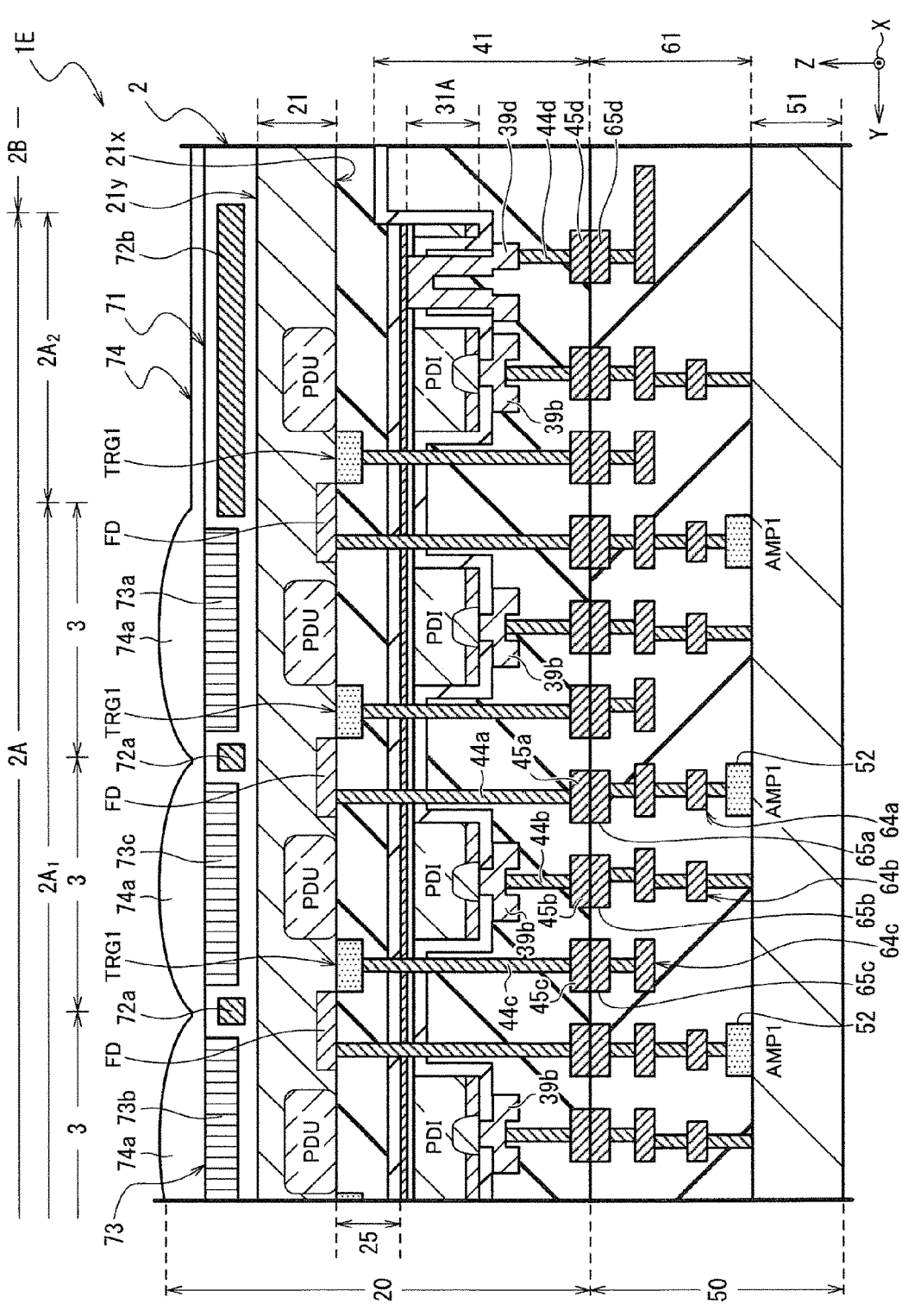
FIG. 11 is a schematic cross-sectional view of a main part illustrating a configuration example of a solid-state imaging device according to a fifth embodiment of the present technology.
Figure 12:
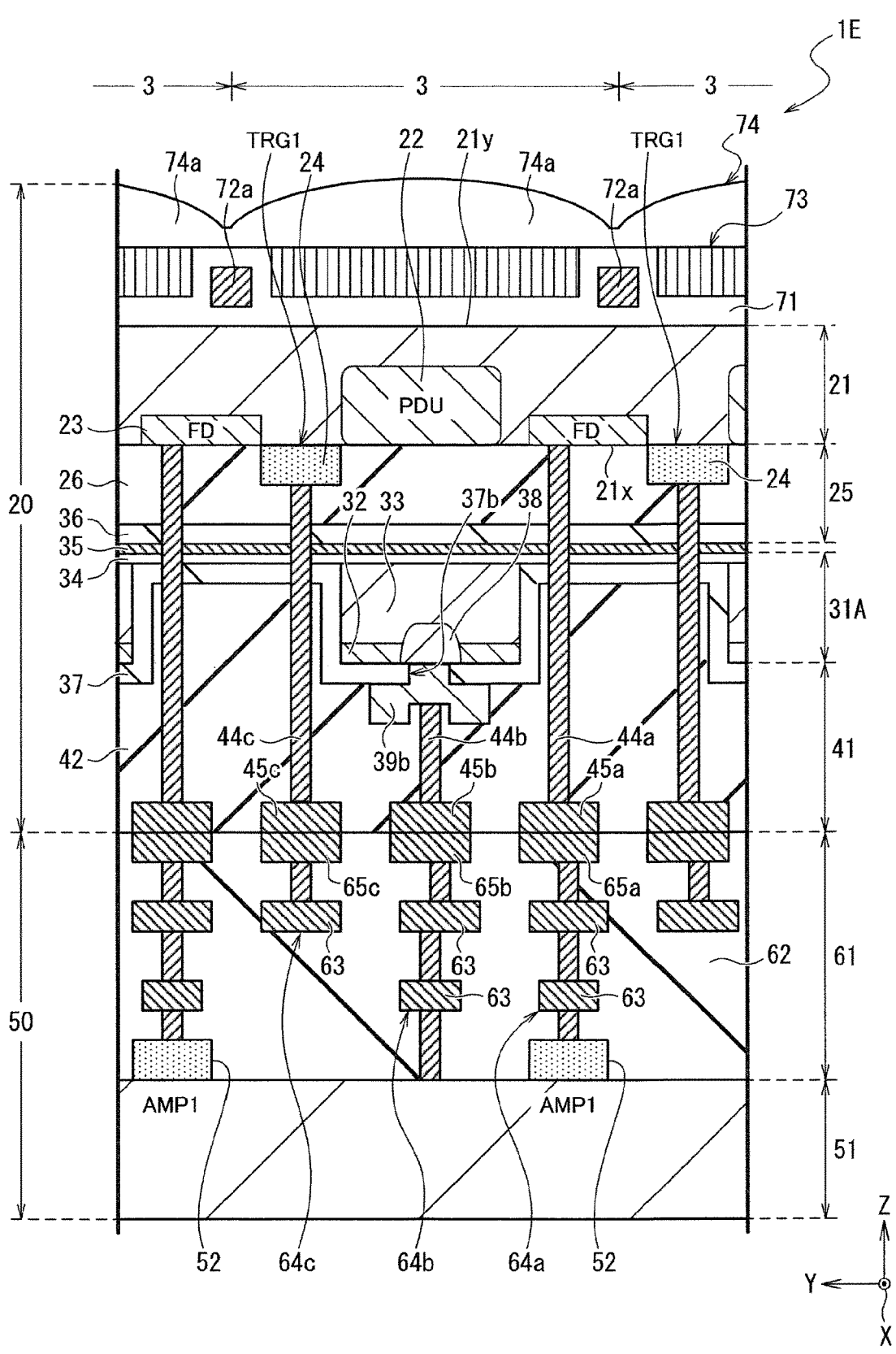
FIG. 12 is a schematic cross-sectional view in which a part of FIG. 11 is enlarged.

As illustrated in FIGS. 11 and 12, a solid-state imaging device 1E according to a fifth embodiment of the present technology basically has a configuration similar to that of the solid-state imaging device 1A according to the first embodiment described above, and the configuration of the second semiconductor layer is different.

That is, as illustrated in FIGS. 11 and 12, in the solid-state imaging device 1E according to the fifth embodiment, the second semiconductor layer 31A extends in the X direction in plan view and is repeatedly arranged at predetermined intervals in the Y direction. The second semiconductor layer 31A is disposed for every pixel 3 in the Y direction. The second insulating layer 41 is embedded between the second semiconductor layers 31A, and a step between the second semiconductor layer 31A and the first semiconductor layer 21 is filled with the second insulating layer 41. The first contact electrode 44*a* penetrates the first insulating layer 25 and the second insulating layer 41 between the second semiconductor layers 31A in plan view, and electrically connects the charge holding region FD and the element-side first metal pad 45*a*. The third contact electrode 44*c* penetrates the first insulating layer 25 and the second insulating layer 41 between the second semiconductor layers 31A in plan view, and electrically connects the gate electrode 24 of the transfer transistor TRG1 and the element-side third metal pad 45*c*. The other configurations are substantially similar to those of the first embodiment described above.

Also in the solid-state imaging device 1E according to the fifth embodiment, effects similar to those of the solid-state imaging device 1A according to the first embodiment described above can be obtained.

Sixth Embodiment

Figure 13:
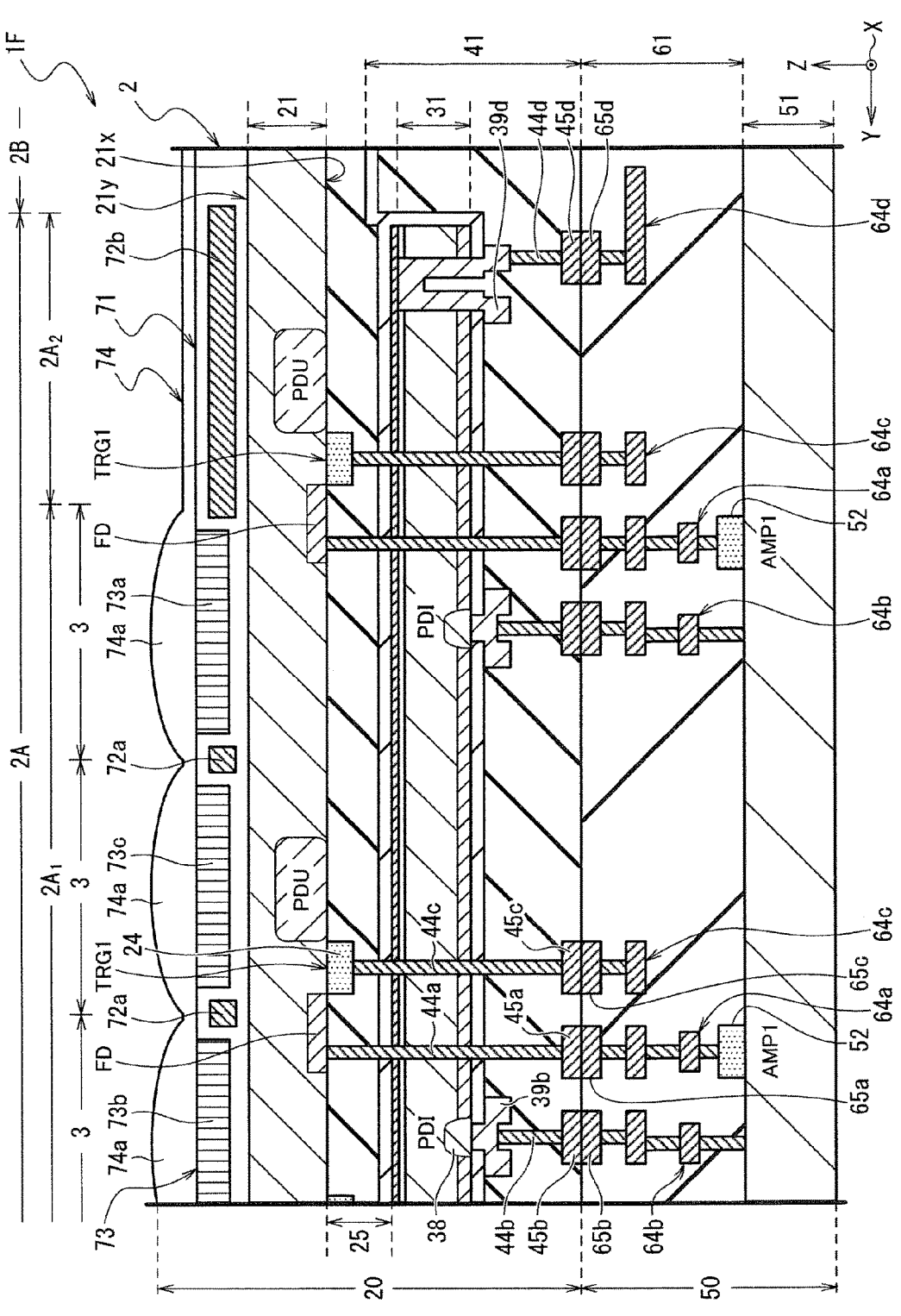
FIG. 13 is a schematic cross-sectional view of a main part illustrating a configuration example of a solid-state imaging device according to a sixth embodiment of the present technology.

As illustrated in FIG. 13, a solid-state imaging device 1F according to a sixth embodiment of the present technology basically has a configuration similar to that of the solid-state imaging device 1A according to the first embodiment described above, and the arrangement of the visible light photoelectric conversion element and the infrared photoelectric conversion element is different.

That is, in the solid-state imaging device 1A according to the first embodiment described above, as illustrated in FIG. 4, the visible light photoelectric conversion element PDU and the infrared photoelectric conversion element PDI are arranged so as to overlap each other in plan view.

On the other hand, in the solid-state imaging device 1F according to the sixth embodiment, as illustrated in FIG. 13, the visible light photoelectric conversion element PDU and the infrared photoelectric conversion element PDI are arranged in a state where the positions of the visible light photoelectric conversion element PDU and the infrared photoelectric conversion element PDI are eccentric so as not to overlap each other in plan view. In the sixth embodiment, the visible light photoelectric conversion element PDU and the infrared photoelectric conversion element PDI are arranged every other pixel 3 arranged in the Y direction in plan view. Furthermore, although not illustrated, the visible light photoelectric conversion element PDU and the infrared photoelectric conversion element PDI are arranged every other pixel 3 arranged in the X direction in plan view.

Also in the solid-state imaging device 1F according to the sixth embodiment, effects similar to those of the solid-state imaging device 1E according to the first embodiment described above can be obtained.

Note that, also in the solid-state imaging device 1E according to the fifth embodiment described above, the visible light photoelectric conversion element PDU and the infrared photoelectric conversion element PDI can be arranged in a state where the positions of the visible light photoelectric conversion element PDU and the infrared photoelectric conversion element PDI are eccentric so as not to overlap each other in plan view.

Seventh Embodiment

Figure 14:
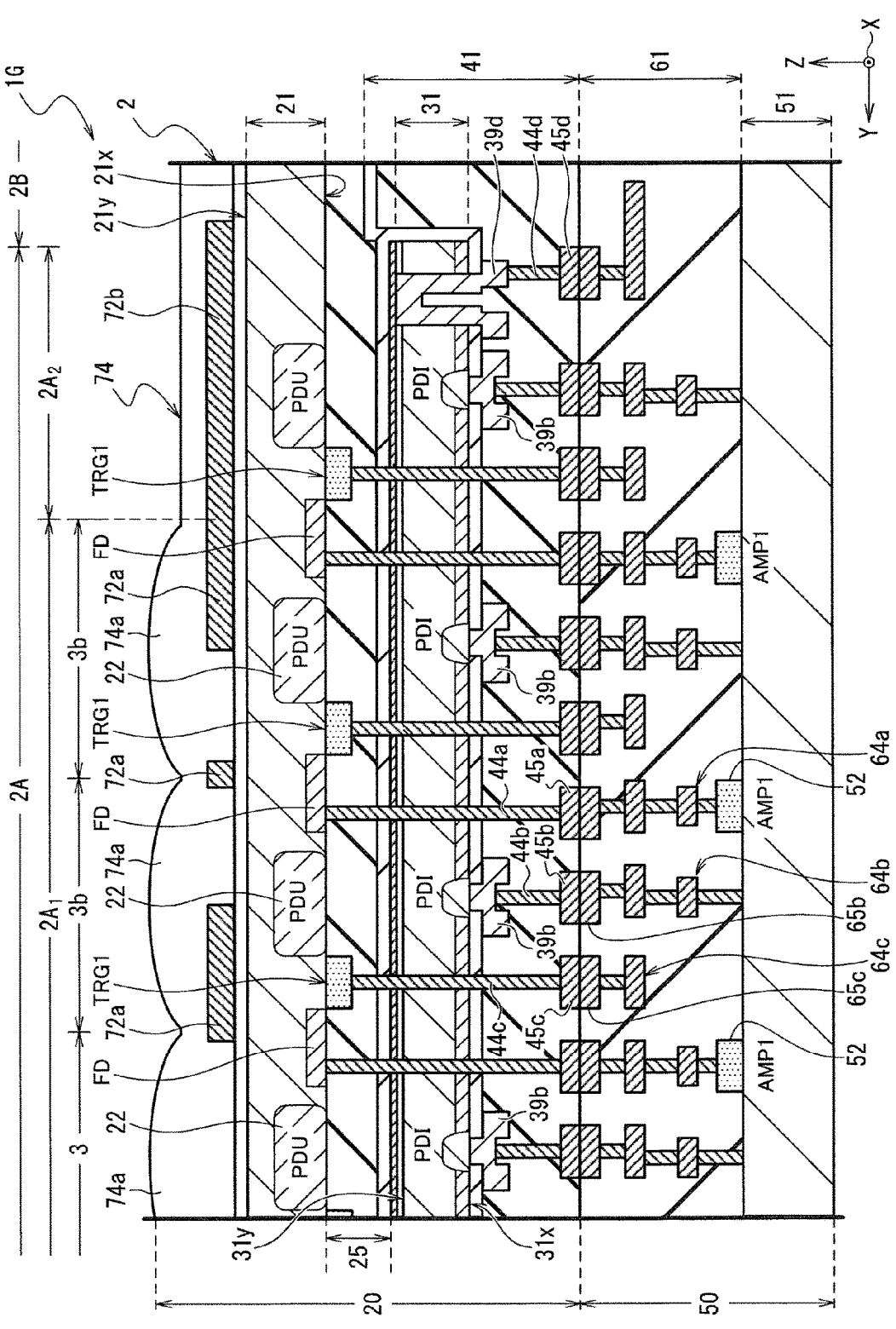
FIG. 14 is a schematic cross-sectional view of a main part illustrating a configuration example of a solid-state imaging device according to a seventh embodiment of the present technology.

As illustrated in FIG. 14, a solid-state imaging device 1G according to a seventh embodiment of the present technology basically has a configuration similar to that of the solid-state imaging device 1A according to the first embodiment described above, and has the following configuration different therefrom.

That is, as illustrated in FIG. 4, the solid-state imaging device 1A according to the above-described first embodiment includes the color filter layer 73.

On the other hand, as illustrated in FIG. 14, the solid-state imaging device 1G according to the seventh embodiment does not include the color filter layer. Then, the solid-state imaging device 1G according to the seventh embodiment includes a phase difference detection pixel 3b. In the phase difference detection pixel 3b, a part of the photoelectric conversion unit 22 of the first semiconductor layer 21 is covered with a light shielding film 72a that shields visible light. Other configurations are substantially similar to those of the first embodiment described above.

With the solid-state imaging device 1G according to the seventh embodiment, effects similar to those of the solid-state imaging device 1A according to the first embodiment described above can be obtained, and the phase difference can be detected by the phase difference detection pixels 3b. Thus, the visible light photoelectric conversion element PDU of the first semiconductor layer 21 and the infrared photoelectric conversion element PDI of the second semiconductor layer 31 can share roles.

Note that, in the seventh embodiment, the case where the color filter layer is omitted has been described, but the color filter layer 73 may be provided as in the above-described first embodiment illustrated in FIGS. 1A and 1B.

Eighth Embodiment

Figure 15:
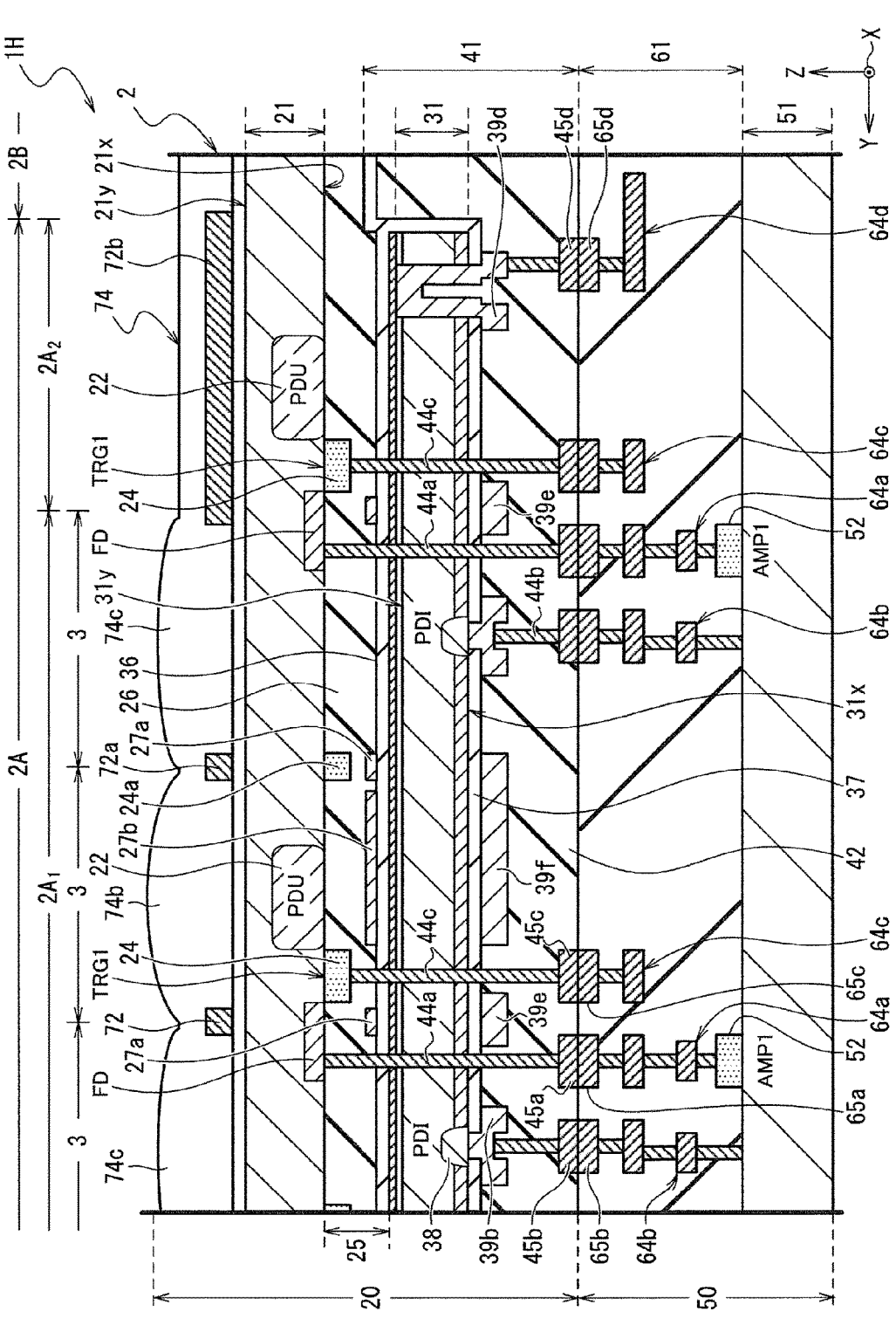
FIG. 15 is a schematic cross-sectional view of a main part illustrating a configuration example of a solid-state imaging device according to an eighth embodiment of the present technology.

As illustrated in FIG. 15, a solid-state imaging device 1H according to an eighth embodiment of the present technology basically has a configuration similar to that of the solid-state imaging device 1F according to the sixth embodiment described above, and has the following configuration different therefrom.

That is, as illustrated in FIG. 13, a solid-state imaging device 1F according to the above-described sixth embodiment includes the color filter layer 73.

On the other hand, as illustrated in FIG. 15, the solid-state imaging device 1H according to the eighth embodiment does not include the color filter layer. Then, in the solid-state imaging device 1H according to the eighth embodiment, a microlens portion 74b in the pixel 3 provided with the visible light photoelectric conversion element PDU and a microlens portion 74c in the pixel 3 provided with the infrared photoelectric conversion element PDI have different shapes.

Then, the solid-state imaging device 1H according to the eighth embodiment includes a light shielding film 24a provided on the first surface 21x side of the first semiconductor layer 21 and light shielding films 27a and 27b provided on the side (second semiconductor layer 31 side) opposite to the first semiconductor layer 21 side of the first insulating layer 25.

Then, the solid-state imaging device 1H according to the eighth embodiment includes a light shielding film 39e and a light shielding film 39f provided on the second semiconductor layer 31 side of the second insulating layer 41. Other configurations are substantially similar to those of the sixth embodiment described above.

The light shielding film 24a is provided at a boundary portion of the pixel 3 in plan view, and has a function of shielding visible light and infrared light. The light shielding film 24a is formed in the same process as the gate electrode 24 of the transfer transistor TRG1, and includes, for example, a polycrystalline silicon film.

The light shielding film 27a is provided at a boundary portion of the pixel 3 in plan view, and has a function of shielding visible light and infrared light. The light shielding film 27b is disposed at a position overlapping the photoelectric conversion unit 22 of the first semiconductor layer 21 in plan view, and has a function of shielding visible light and infrared light. Each of the light shielding films 27a and 27b is provided between the insulating film 26 of the first insulating layer 25 and the protective film 36. Then, each of the light shielding films 27a and 27b is formed in the same step, and includes, for example, an aluminum film or an aluminum alloy film.

The light shielding film 39e is provided at a boundary portion of the pixel 3 in plan view, and has a function of shielding visible light and infrared light. The light shielding film 39f is disposed at a position overlapping the photoelectric conversion unit 22 of the first semiconductor layer 21 in plan view, and has a function of shielding visible light and infrared light. Each of the light shielding films 39e and 39f is provided between the insulating film 37 and the insulating film 42 of the second insulating layer 41. Then, each of the light shielding films 39e and 39f is formed in the same step as the first electrode 39b and the lead-out electrode 39d, and is formed by, for example, a stacked film of titanium and tungsten.

With the solid-state imaging device 1H according to the eighth embodiment, effects similar to those of the solid-state imaging device 1F according to the sixth embodiment described above can be obtained, and since the light shielding films 24a, 27a, 27b, 39e, and 39f are provided, infrared light incident on a predetermined pixel 3 can be prevented from leaking into the infrared photoelectric conversion element PDI of the adjacent pixel 3, and sensitivity (accuracy of photoelectric conversion) of the infrared photoelectric conversion element PDI in one pixel 3 can be enhanced.

Note that, in the eighth embodiment, the case where the light shielding films 24a, 27a, 27b, 39e, and 39f are provided has been described. It is preferable to include all the light shielding films 24a, 27a, 27b, 39e, and 39f, but by including at least one of the light shielding films 24a, 27a, 27b, 39e, or 39f, the sensitivity (accuracy of photoelectric conversion) of the infrared photoelectric conversion element PDI in one pixel 3 can be enhanced.

Furthermore, in the eighth embodiment, the case where the color filter layer is omitted has been described, but the color filter layer 73 may be provided as in the above-described sixth embodiment illustrated in FIG. 13.

In addition, the contact layer 34 of the second semiconductor layer 31 may be thickened and used as a visible light cut filter.

Ninth Embodiment

Figure 16:
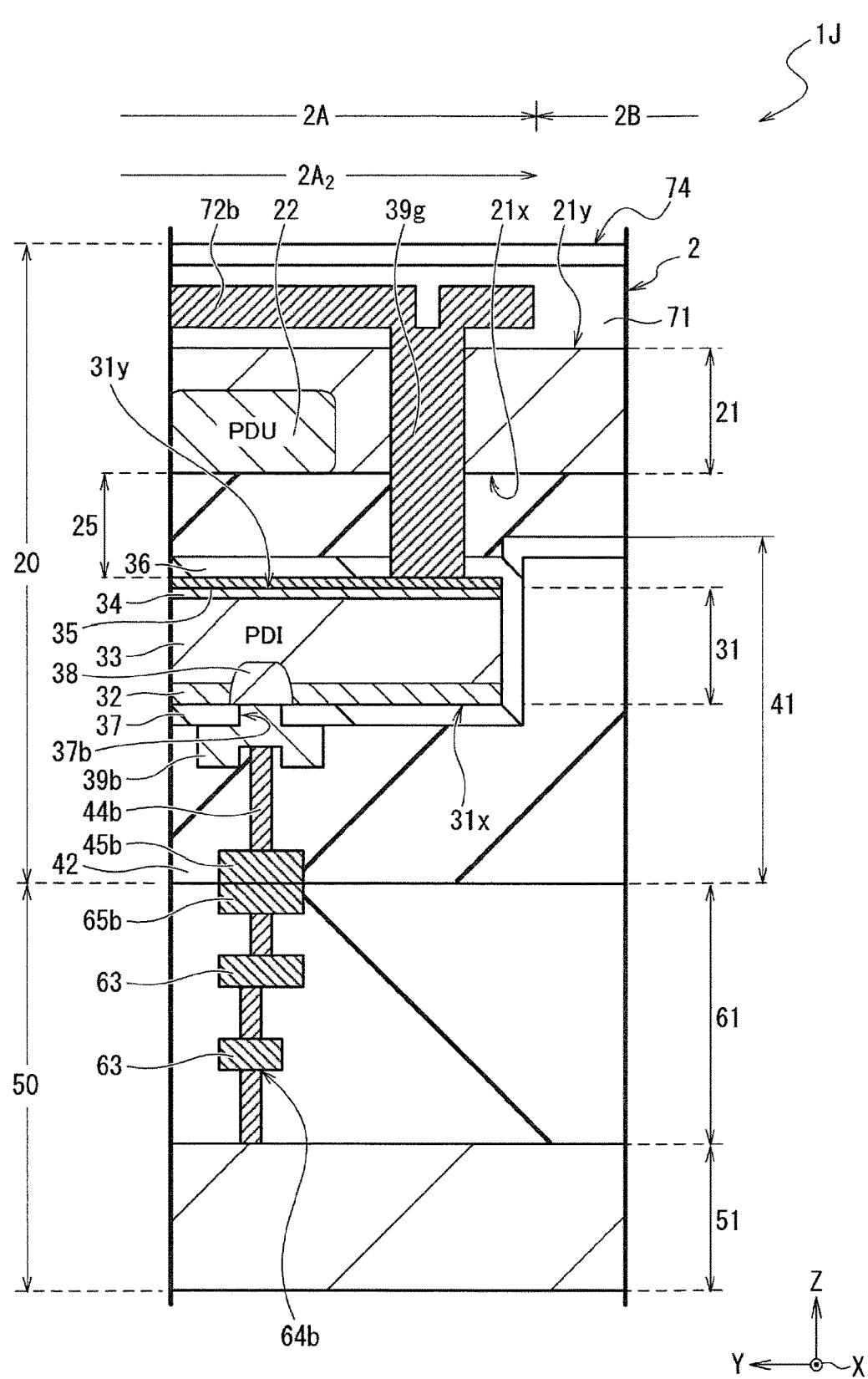
FIG. 16 is a schematic cross-sectional view of a main part illustrating a configuration example of a solid-state imaging device according to a ninth embodiment of the present technology.

As illustrated in FIG. 16, a solid-state imaging device 1J according to a ninth embodiment of the present technology basically has a configuration similar to that of the solid-state imaging device 1A according to the first embodiment described above, and has a different configuration of the lead-out electrode.

That is, as illustrated in FIG. 5B, the lead-out electrode 39d of the solid-state imaging device 1A according to the above-described first embodiment is electrically and mechanically connected to the second electrode 35 through a connection hole penetrating from the first surface 31x side to the second surface 31y side of the second semiconductor layer 31.

On the other hand, as illustrated in FIG. 16, a lead-out electrode 39g of the solid-state imaging device 1J according to the ninth embodiment is electrically and mechanically connected to the second electrode 35 through a connection hole penetrating from the second surface 21y side of the first semiconductor layer 21 to the first surface 31x side of the second semiconductor layer 31, and is electrically connected to the first semiconductor layer 21. Then, the lead-out electrode 39g is formed integrally with the light shielding film 72b. Then, although not illustrated in detail, the light shielding film 72b is lead out to the peripheral region 2B around the pixel region 2A, and is electrically connected to the circuit-side second metal pads 65d and 65e of the circuit substrate unit 50 in the peripheral region 2B. That is, the cathode region of each of the visible light photoelectric conversion element PDU and the infrared photoelectric conversion element PDI is electrically connected to the reference potential wirings (for example, ground wirings) V7 and V4 via a conductive path including the lead-out electrode 39g.

With the solid-state imaging device 1J according to the ninth embodiment, effects similar to those of the solid-state imaging device 1A according to the first embodiment described above can be obtained, and a conductive path for electrically connecting the respective cathodes of the visible light photoelectric conversion element PDU and the infrared photoelectric conversion element PDI to the reference potential wiring of the circuit substrate unit 50 can be shared.

Tenth Embodiment

Application Example to Electronic Device

The present technology (technology according to the present disclosure) can be applied to, for example, various electronic devices such as an imaging device such as a digital still camera or a digital video camera, a mobile phone having an imaging function, or another device having an imaging function.

FIG. 17 is a diagram illustrating a schematic configuration of an electronic device (for example, a camera) according to a tenth embodiment of the present technology.

As illustrated in FIG. 17, the electronic device 100 includes a solid-state imaging device 101, the optical lens 102, a shutter device 103, a drive circuit 104, and a signal processing circuit 105. The electronic device 100 illustrates an embodiment in a case where the solid-state imaging device 1A, 1B, 1C, 1D, 1E, 1F, 1G, 1H, or 1J according to the first to sixth embodiments of the present technology is used as the solid-state imaging device 101 in an electronic device (for example, a camera).

The optical lens 102 forms an image of image light (incident light 106) from a subject on an imaging surface of the solid-state imaging device 101. Thus, signal charges are accumulated in the solid-state imaging device 101 over a certain period. The shutter device 103 controls a light irradiation period and a light shielding period for the solid-state imaging device 101. The drive circuit 104 supplies a drive signal for controlling a transfer operation of the solid-state imaging device 101 and a shutter operation of the shutter device 103. A signal of the solid-state imaging device 101 is transferred by a drive signal (timing signal) supplied from the drive circuit 104. The signal processing circuit 105 performs various types of signal processing on a signal (pixel signal) output from the solid-state imaging device 101. An image signal subjected to the signal processing is stored in a storage medium such as a memory or output to a monitor.

With such a configuration, in the electronic device 100 according to the tenth embodiment, the light reflection suppressing portion in the solid-state imaging device 101 suppresses light reflection at the light shielding film or the insulating film in contact with the air layer, so that it is possible to suppress shaking and to improve image quality.

Note that the electronic device 100 to which the solid-state imaging device 1 can be applied is not limited to a camera, and can also be applied to other electronic devices. For example, the solid-state imaging device 1 may be applied to an imaging device such as a camera module for a mobile device such as a mobile phone or a tablet terminal.

Note that the present technology may have the following configuration.

(1)

A solid-state imaging device, including:

a first semiconductor layer that includes a first photoelectric conversion element that has a first surface and a second surface located opposite to each other and photoelectrically converts light incident from a side of the second surface, and a charge holding region that holds a signal charge photoelectrically converted by the first photoelectric conversion element;

a second semiconductor layer that is disposed on a side of the first surface of the first semiconductor layer with a first insulating layer interposed therebetween and includes a second photoelectric conversion element that photoelectrically converts light incident from the side of the second surface of the first semiconductor layer;

a circuit substrate unit that is disposed on a side of the second semiconductor layer opposite to a side of the first insulating layer with a second insulating layer interposed therebetween and includes a readout circuit that reads out signal charges photoelectrically converted by the first photoelectric conversion element;

an element-side first metal pad that is provided on a side of the second insulating layer opposite to a side of the second semiconductor layer;

a circuit-side first metal pad that is provided on the circuit substrate unit and is electrically connected to the readout circuit and bonded to the element-side first metal pad; and a first contact electrode that penetrates the first and second insulating layers and electrically connects the charge holding region and the element-side first metal pad.

(2)

The solid-state imaging device according to (1) above, in which the first contact electrode extends in a thickness direction of each of the first and second insulating layers.

(3)

The solid-state imaging device according to (1) or (2) above, further including a pixel region in which a plurality of pixels is arranged in a matrix, in which the first contact electrode is disposed in the pixel region in plan view.

(4)

The solid-state imaging device according to any one of (1) to (3) above, in which the second photoelectric conversion element photoelectrically converts light incident from the side of the second surface of the first semiconductor layer and transmitted through the first semiconductor layer.

(5)

The solid-state imaging device according to any one of (1) to (4) above, in which the first photoelectric conversion element is a visible light photoelectric conversion element that photoelectrically converts light having a wavelength in a visible region, and the second photoelectric conversion element is an infrared photoelectric conversion element that photoelectrically converts light having a wavelength in an infrared region.

(6)

The solid-state imaging device according to any one of (1) to (5) above, in which the first semiconductor layer contains Si, and the second semiconductor layer contains at least one compound semiconductor material of InGaAs, InAsSb, InAs, InSb, or HgCdTe, or Ge.

(7)

The solid-state imaging device according to any one of (1) to (6) above, in which each of the first photoelectric conversion element and the second photoelectric conversion element is disposed so as to overlap each other in plan view.

(8)

The solid-state imaging device according to any one of (1) to (7) above, in which the first contact electrode penetrates the second semiconductor layer.

(9)

The solid-state imaging device according to any one of (1) to (8) above, in which the readout circuit is a first readout circuit, and the solid-state imaging device further includes:

a second readout circuit that is provided in the circuit substrate unit and reads out signal charges photoelectrically converted by the second photoelectric conversion element;

an element-side second metal pad that is provided on the side of the second insulating layer opposite to the side of the second semiconductor layer;

a circuit-side second metal pad that is provided on the circuit substrate unit and is electrically connected to the second readout circuit and bonded to the element-side second metal pad to oppose the element-side second metal pad; and a second contact electrode that penetrates the second insulating layer and electrically connects the second photoelectric conversion element and the element-side second metal pad.

(10)

The solid-state imaging device according to any one of (1) to (8) above, in which the readout circuit has a circuit configuration of reading out a signal charge photoelectrically converted by the first photoelectric conversion element and a signal charge photoelectrically converted by the second photoelectric conversion element, and the solid-state imaging device further includes:

an element-side second metal pad that is provided on the side of the second insulating layer opposite to the side of the second semiconductor layer;

a circuit-side second metal pad that is provided on the circuit substrate unit and is electrically connected to the readout circuit and bonded to the element-side second metal pad; and a second contact electrode that penetrates the first and second insulating layers and electrically connects the second photoelectric conversion element and the element-side second metal pad.

(11)

The solid-state imaging device according to any one of (1) to (10) above, further including:

a transfer transistor that is provided in the first semiconductor layer and transfers signal charges photoelectrically converted by the first photoelectric conversion element to the charge holding region;

an element-side third metal pad that is provided on the side of the second insulating layer opposite to the side of the second semiconductor layer;

a circuit-side third metal pad that is provided on the circuit substrate unit and bonded to oppose the element-side third metal pad; and a third contact electrode that penetrates the first and second insulating layers and electrically connects a gate electrode of the transfer transistor and the element-side third metal pad.

(12)

The solid-state imaging device according to any one of (1) to (11) above, further including:

a second electrode that is provided on the side of the first insulating layer of the second semiconductor layer;

a lead-out electrode that is provided on the second insulating layer side of the second semiconductor layer, penetrates the second semiconductor layer, and is electrically connected to the second electrode;

an element-side fourth metal pad that is provided on the side of the second insulating layer opposite to the side of the second semiconductor layer;

a circuit-side fourth metal pad that is provided on the circuit substrate unit and bonded to oppose the element-side fourth metal pad; and a fourth contact electrode that penetrates the second insulating layer and electrically connects the lead-out electrode and the element-side fourth metal pad.

(13)

The solid-state imaging device according to any one of (1) to (8) above, in which the readout circuit is shared by a plurality of the first photoelectric conversion elements.

(14)

The solid-state imaging device according to any one of (1) to (13) above, in which the second semiconductor layer extends in an X direction out of the X direction and a Y direction orthogonal to each other in plan view, and is repeatedly arranged at a predetermined interval in the Y direction.

(15)

The solid-state imaging device according to any one of (1) to (6) above, in which the first photoelectric conversion element and the second photoelectric conversion element are arranged in a state where positions of the first photoelectric conversion element and the second photoelectric conversion element are eccentric so as not to overlap each other in plan view. (16)

A method of manufacturing a solid-state imaging device, including:

forming a first photoelectric conversion element in a first semiconductor layer;
   stacking a second semiconductor layer on a side opposite to a side of a light incident surface of the first semiconductor layer; and
   forming a second photoelectric conversion element in the second semiconductor layer stacked on the first semiconductor layer.

(17)

The method of manufacturing the solid-state imaging device according to (16) above, in which the first photoelectric conversion element is a visible light photoelectric conversion element that photoelectrically converts light having a wavelength in a visible region, and
   the second photoelectric conversion element is an infrared photoelectric conversion element that photoelectrically converts light having a wavelength in an infrared region.

(18)

An electronic device including a solid-state imaging device, an optical lens that forms an image of image light from a subject on an imaging surface of the solid-state imaging device, and a signal processing circuit that performs signal processing on a signal output from the solid-state imaging device, in which the solid-state imaging device includes:
   a first semiconductor layer that includes a first photoelectric conversion element that has a first surface and a second surface located opposite to each other and photoelectrically converts light incident from a side of the second surface, and a charge holding region that holds a signal charge photoelectrically converted by the first photoelectric conversion element;
   a second semiconductor layer that is disposed on a side of the first surface of the first semiconductor layer with a first insulating layer interposed therebetween and includes a second photoelectric conversion element that photoelectrically converts light incident from the side of the second surface of the first semiconductor layer;
   a circuit substrate unit that is disposed on a side of the second semiconductor layer opposite to a side of the first insulating layer with a second insulating layer interposed therebetween and includes a readout circuit that reads out signal charges photoelectrically converted by the first photoelectric conversion element;
   an element-side first metal pad that is provided on a side of the second insulating layer opposite to a side of the second semiconductor layer;
   a circuit-side first metal pad that is provided on the circuit substrate unit and is electrically connected to the readout circuit and bonded to the element-side first metal pad; and a first contact electrode that penetrates the first and second insulating layers and electrically connects the charge holding region and the element-side first metal pad.

The scope of the present technology is not limited to the illustrated and described exemplary embodiments, but also includes all embodiments that provide equivalent effects to those for which the present technology is intended. Moreover, the scope of the present technology is not limited to the combinations of the characteristics of the invention defined by the claims, but may be defined by any desired combination of specific characteristics among all the disclosed respective characteristics.

REFERENCE SIGNS LIST

1A Solid-state imaging device
2 Semiconductor chip
2A Pixel region
2A$_1$ Effective pixel region
2A$_2$ Optical black region
3, 3a, 3b Pixel
4 Vertical drive circuit
5 Column signal processing circuit
6 Horizontal drive circuit
7 Output circuit
8 Control circuit
10 Pixel drive line
11 Vertical signal line
12 Horizontal signal line
13 Logic circuit
14 Bonding pad
15 First readout circuit
16 Second readout circuit
17a, 17b Capacitor element
20 Photoelectric conversion substrate unit
21 First semiconductor layer
22 Photoelectric conversion unit
23 n-type semiconductor region
24 Gate electrode
25 First insulating layer
26 Insulating film
31 Second semiconductor layer
32 Cap layer
33 Photoelectric conversion layer
34 Contact layer
35 Second electrode
36 Protective film
37 Insulating film
38 Contact region
39b First electrode
39d Lead-out electrode
39e, 39f Light shielding film
41 Second insulating layer
42 Insulating film
44a First contact electrode
44b Second contact electrode
44c Third contact electrode
44d Fourth contact electrode
44e Fifth contact electrode
45a Element-side first metal pad
45b Element-side second metal pad
45c Element-side third metal pad
45d Element-side fourth metal pad
45e Element-side fifth metal pad
50 Circuit substrate unit
51 Semiconductor substrate
52 Gate electrode 61 Multilayer wiring layer
62 Interlayer insulating film
64a First wiring path
64b Second wiring path
64c Third wiring path
64d Fourth wiring path
65a Circuit-side first metal pad
65b Circuit-side second metal pad
65c Circuit-side third metal pad
65d Circuit-side fourth metal pad
65e Circuit-side fifth metal pad
71 Insulating layer
72a, 72b Light shielding film
73 Color filter layer
74 Microlens layer
AMP1, AMP2 Amplification transistor
FD Charge holding region
OFG Discharge transistor
PDI Infrared photoelectric conversion element (second photoelectric conversion element)
PDU Visible light photoelectric conversion element (first photoelectric conversion element)
RST1, RST2 Reset transistor
SEL1, SEL2 Selection transistor
TRG1, TRG2 Transfer transistor
The invention claimed is:

1. A solid-state imaging device, comprising:
a first semiconductor layer that includes a first photoelectric conversion element and a charge holding region, wherein
  the first semiconductor layer has a first surface and a second surface,
  the second surface is opposite to the first surface,
  the first photoelectric conversion element is configured to photoelectrically convert first light, incident from a side of the second surface, to a first signal charge, and
  the charge holding region is configured to hold the first signal charge;
a second semiconductor layer on a side of the first surface of the first semiconductor layer, wherein
  the second semiconductor layer includes a second photoelectric conversion element, and
  the second photoelectric conversion element is configured to photoelectrically convert second light, incident from the side of the second surface of the first semiconductor layer, to a second signal charge;
a first insulating layer between the first semiconductor layer and the second semiconductor layer:
a circuit substrate unit on a first side of the second semiconductor layer, wherein
  the first side of the second semiconductor layer is opposite to a side of the first insulating layer,
  the circuit substrate unit includes a first readout circuit and a second readout circuit,
  the first readout circuit is configured to read out the first signal charge, and
  the second readout circuit is configured to read out the second signal charge;
a second insulating layer between the second semiconductor layer and the circuit substrate unit;
an element-side first metal pad on a side of the second insulating layer, wherein the side of the second insulating layer is opposite to a second side of the second semiconductor layer;
an element-side second metal pad on the side of the second insulating layer;

a circuit-side first metal pad on the circuit substrate unit, wherein the circuit-side first metal pad is electrically connected to the first readout circuit and bonded to the element-side first metal pad;
a circuit-side second metal pad on the circuit substrate unit, wherein
  the circuit-side second metal pad is electrically connected to the second readout circuit and bonded to the element-side second metal pad, and
  the circuit-side second metal pad opposes the element-side second metal pad;
a first contact electrode that penetrates the first insulating layer and the second insulating layer, wherein the first contact electrode is configured to electrically connect the charge holding region and the element-side first metal pad; and
a second contact electrode that penetrates the first insulating layer and the second insulating layer, wherein the second contact electrode is configured to electrically connect the second photoelectric conversion element and the element-side second metal pad.

2. The solid-state imaging device according to claim 1, wherein the first contact electrode extends in a thickness direction of each of the first insulating layer and the second insulating layer.

3. The solid-state imaging device according to claim 1, further comprising a pixel region, wherein
  in the pixel region, a plurality of pixels is in a matrix arrangement, and
  the first contact electrode is in the pixel region in a plan view of the solid-state imaging device.

4. The solid-state imaging device according to claim 1, wherein the second light enters the second photoelectric conversion element via the first semiconductor layer.

5. The solid-state imaging device according to claim 1, wherein
  the first photoelectric conversion element is a visible light photoelectric conversion element,
  the visible light photoelectric conversion element is configured to photoelectrically convert, to the first signal charge, the first light that has a wavelength in a visible region,
  the second photoelectric conversion element is an infrared photoelectric conversion element, and
  the infrared photoelectric conversion element is configured to photoelectrically convert, to the second signal charge, the second light that has a wavelength in an infrared region.

6. The solid-state imaging device according to claim 1, wherein
  the first semiconductor layer includes silicon (Si),
  the second semiconductor layer includes at least one a compound semiconductor material or germanium (Ge), and
  the compound semiconductor material includes at least one of indium gallium arsenide (InGaAs), indium arsenide antimony (InAsSb), indium arsenide (InAs), indium antimony (InSb), or mercury cadmium telluride (HgCdTe).

7. The solid-state imaging device according to claim 1, wherein the first photoelectric conversion element overlaps with the second photoelectric conversion element in a plan view of the solid-state imaging device.

8. The solid-state imaging device according to claim 1, wherein the first contact electrode penetrates the second semiconductor layer.

9. The solid-state imaging device according to claim 1, further comprising:

a transfer transistor in the first semiconductor layer, wherein the transfer transistor is configured to transfer the first signal charge to the charge holding region;

an element-side third metal pad on the side of the second insulating layer;

a circuit-side third metal pad that is provided on the circuit substrate unit, wherein the circuit-side third metal pad is bonded to the element-side third metal pad, and the circuit-side third metal pad opposes the element-side third metal pad; and a third contact electrode that penetrates the first insulating layer and the second insulating layer, wherein the third contact electrode is configured to electrically connect a gate electrode of the transfer transistor and the element-side third metal pad.

10. The solid-state imaging device according to claim 1, further comprising:

a second electrode on the side of the first insulating layer;

a lead-out electrode on the side of the second insulating layer, wherein the lead-out electrode penetrates the second semiconductor layer, and the lead-out electrode is electrically connected to the second electrode;

an element-side fourth metal pad on the side of the second insulating layer;

a circuit-side fourth metal pad on the circuit substrate unit, wherein the circuit-side fourth metal pad is bonded to the element-side fourth metal pad, and the circuit-side fourth metal pad opposes the element-side fourth metal pad; and a fourth contact electrode that penetrates the second insulating layer, wherein the fourth contact electrode is configured to electrically connect the lead-out electrode and the element-side fourth metal pad.

11. The solid-state imaging device according to claim 1, further comprising a plurality of first photoelectric conversion elements, wherein the plurality of first photoelectric conversion elements includes the first photoelectric conversion element, and the plurality of first photoelectric conversion elements shares the first readout circuit.

12. The solid-state imaging device according to claim 1, wherein in a plan view of the solid-state imaging device, the second semiconductor layer extends in an X direction of the plan view, in the plan view, the second semiconductor layer is at specific intervals in a Y direction of the plan view, and the Y direction is orthogonal to the X direction.

13. The solid-state imaging device according to claim 1, wherein positions of the first photoelectric conversion element and the second photoelectric conversion element are eccentric, and in a plan view of the solid-state imaging device, the first photoelectric conversion element is non-overlapping with the second photoelectric conversion element.

14. A method of manufacturing a solid-state imaging device, the method comprising:

forming a first photoelectric conversion element and a charge holding region in a first semiconductor layer, wherein the first semiconductor layer has a first surface and a second surface, the second surface is opposite to the first surface, the first photoelectric conversion element is configured to photoelectrically convert first light, incident from a side of the second surface, to a first signal charge, and the charge holding region is configured to hold the first signal charge;

stacking a second semiconductor layer on a side of the first surface of the first semiconductor layer with a first insulating layer therebetween;

forming a second photoelectric conversion element in the second semiconductor layer, wherein the second photoelectric conversion element is configured to photoelectrically convert second light, incident from the side of the second surface of the first semiconductor layer, to a second signal charge;

forming a first contact electrode that penetrates the first insulating layer and the second insulating layer;

forming a second contact electrode that penetrates the first insulating layer and the second insulating layer;

forming each of an element-side first metal pad and an element-side second metal pad, wherein the first contact electrode is configured to electrically connect the charge holding region and the element-side first metal pad, and the second contact electrode is configured to electrically connect the second photoelectric conversion element and the element-side second metal pad;

forming a circuit substrate unit that includes a first readout circuit and a second readout circuit, wherein the first readout circuit is configured to read out the first signal charge, and the second readout circuit is configured to read out the second signal charge;

forming each of a circuit-side first metal pad and a circuit-side second metal pad on the circuit substrate unit; and bonding the circuit substrate unit to the second semiconductor layer with a second insulating layer therebetween, wherein the circuit substrate unit is on a first side of the second semiconductor layer, the first side of the second semiconductor layer is opposite to a side of the first insulating layer, each of the element-side first metal pad and the element-side second metal pad is on a side of the second insulating layer, the side of the second insulating layer is opposite to a second side of the second semiconductor layer, the circuit-side first metal pad is electrically connected to the first readout circuit and bonded to the element-side first metal pad, the circuit-side first metal pad opposes the element-side first metal pad, the circuit-side second metal pad is electrically connected to the second readout circuit and bonded to the element-side second metal pad, and the circuit-side second metal pad opposes the element-side second metal pad.

15. The method of manufacturing the solid-state imaging device according to claim 14, wherein the first photoelectric conversion element is a visible light photoelectric conversion element, the visible light photoelectric conversion element is configured to photoelectrically convert, to the first signal charge, the first light that has a wavelength in a visible region, the second photoelectric conversion element is an infrared photoelectric conversion element, and the infrared photoelectric conversion element is configured to photoelectrically convert, to the second signal charge, the second light that has a wavelength in an infrared region.

16. An electronic device, comprising:

a solid-state imaging device;

an optical lens configured to form, on an imaging surface of the solid-state imaging device, an image of image light from a subject; and a signal processing circuit configured to execute a signal processing operation on a signal output from the solid-state imaging device, wherein the solid-state imaging device includes:

a first semiconductor layer that includes a first photoelectric conversion element and a charge holding region, wherein the first semiconductor layer has a first surface and a second surface, the second surface is opposite to the first surface, the first photoelectric conversion element is configured to photoelectrically convert first light, incident from a side of the second surface, to a first signal charge, and the charge holding region is configured to hold the first a signal charge;

a second semiconductor layer on a side of the first surface of the first semiconductor layer, wherein the second semiconductor layer includes a second photoelectric conversion element, and the second photoelectric conversion element is configured to photoelectrically convert second light, incident from the side of the second surface of the first semiconductor layer, to a second signal charge;

a first insulating layer between the first semiconductor layer and the second semiconductor layer;

a circuit substrate unit on a first side of the second semiconductor layer, wherein the first side of the second semiconductor layer is opposite to a side of the first insulating layer, the circuit substrate unit includes a first readout circuit and a second readout circuit, the first readout circuit is configured to read out the first signal charge, and the second readout circuit is configured to read out the second signal charge;

a second insulating layer between the second semiconductor layer and the circuit substrate unit;

an element-side first metal pad on a side of the second insulating layer, wherein the side of the second insulating layer is opposite to a second side of the second semiconductor layer;

an element-side second metal pad on the side of the second insulating layer;

a circuit-side first metal pad on the circuit substrate unit, wherein the circuit-side first metal pad is electrically connected to the first readout circuit and bonded to the element-side first metal pad;

a circuit-side second metal pad on the circuit substrate unit, wherein the circuit-side second metal pad is electrically connected to the second readout circuit and bonded to the element-side second metal pad, and the circuit-side second metal pad opposes the element-side second metal pad;

a first contact electrode that penetrates the first insulating layer and the second insulating layer, wherein the first contact electrode is configured to electrically connect the charge holding region and the element-side first metal pad; and a second contact electrode that penetrates the first insulating layer and the second insulating layer, wherein the second contact electrode is configured to electrically connect the second photoelectric conversion element and the element-side second metal pad.

17. A solid-state imaging device, comprising:

a first semiconductor layer that includes a first photoelectric conversion element and a charge holding region, wherein the first semiconductor layer has a first surface and a second surface, the second surface is opposite to the first surface, the first photoelectric conversion element is configured to photoelectrically convert first light, incident from a side of the second surface, to a first signal charge, and the charge holding region is configured to hold the first signal charge;

a second semiconductor layer on a side of the first surface of the first semiconductor layer, wherein the second semiconductor layer includes a second photoelectric conversion element, and the second photoelectric conversion element is configured to photoelectrically convert second light, incident from the side of the second surface of the first semiconductor layer, to a second signal charge;

a first insulating layer between the first semiconductor layer and the second semiconductor layer;

a circuit substrate unit on a first side of the second semiconductor layer, wherein the first side of the second semiconductor layer is opposite to a side of the first insulating layer, the circuit substrate unit includes a readout circuit, the readout circuit has a specific circuit configuration, and the readout circuit is configured to:

read out the first signal charge; and read out the second signal charge;

a second insulating layer between the second semiconductor layer and the circuit substrate unit;

an element-side first metal pad on a side of the second insulating layer, wherein the side of the second insulating layer is opposite to a second side of the second semiconductor layer;

an element-side second metal pad on the side of the second insulating layer;

a circuit-side first metal pad on the circuit substrate unit, wherein the circuit-side first metal pad is electrically connected to the first readout circuit and bonded to the element-side first metal pad;

a circuit-side second metal pad on the circuit substrate unit, wherein the circuit-side second metal pad is electrically connected to the second readout circuit and bonded to the element-side second metal pad;

a first contact electrode that penetrates the first insulating layer and the second insulating layer, wherein the first contact electrode is configured to electrically connect the charge holding region and the element-side first metal pad; and a second contact electrode that penetrates the first insulating layer and the second insulating layer, wherein the second contact electrode is configured to electrically connect the second photoelectric conversion element and the element-side second metal pad.

* * * * *